(12) United States Patent
Khizroev et al.

(10) Patent No.: US 8,345,518 B2
(45) Date of Patent: Jan. 1, 2013

(54) NEAR FIELD OPTICAL RECORDING SYSTEM HAVING NEGATIVE INDEX OF REFRACTION STRUCTURE

(75) Inventors: Sakhrat Khizroev, Riverside, CA (US); Rabee Ikkawi, Pembroke Pines, FL (US); Nissim Amos, Moreno Valley, CA (US); Roman Chomko, Riverside, CA (US); Alexander Balandin, Riverside, CA (US)

(73) Assignee: The Regents of the University of California, Oakland, CA (US)

( * ) Notice: Subject to any disclaimer, the term of this patent is extended or adjusted under 35 U.S.C. 154(b) by 506 days.

(21) Appl. No.: 12/505,434

(22) Filed: Jul. 17, 2009

(65) Prior Publication Data

US 2012/0307606 A1 Dec. 6, 2012

Related U.S. Application Data

(60) Provisional application No. 61/082,105, filed on Jul. 18, 2008, provisional application No. 61/147,042, filed on Jan. 23, 2009.

(51) Int. Cl.
*G11B 11/00* (2006.01)

(52) U.S. Cl. ............ 369/13.33; 369/13.13; 369/120; 360/59

(58) Field of Classification Search ............ 369/13.33, 369/13.13, 13.32, 13.02, 126, 103, 120; 360/59; 385/129, 31, 88–94; 250/201.3, 201.5
See application file for complete search history.

(56) References Cited

U.S. PATENT DOCUMENTS

| | | | | |
|---|---|---|---|---|
| 6,005,791 A * | 12/1999 | Gudesen et al. | ............ | 365/114 |
| 7,352,941 B2 * | 4/2008 | Bratkovski et al. | ............ | 385/129 |
| 7,421,178 B2 * | 9/2008 | Podolskiy et al. | ............ | 385/129 |
| 8,098,971 B2 * | 1/2012 | Bratkovski et al. | ............ | 385/129 |
| 8,169,879 B2 * | 5/2012 | Kamiguchi et al. | ..... | 369/112.24 |
| 2006/0187795 A1 * | 8/2006 | Redfield et al. | ............ | 369/103 |
| 2009/0268511 A1 * | 10/2009 | Birge et al. | ............ | 365/151 |
| 2010/0134898 A1 * | 6/2010 | Shalaev et al. | ............ | 359/665 |

* cited by examiner

*Primary Examiner* — Tan X Dinh
(74) *Attorney, Agent, or Firm* — Knobbe, Martens, Olson & Bear, LLP

(57) ABSTRACT

High density-information storage is accomplished by the use of novel, near-field optical devices in combination with high-density storage media. The near-field optical devices are configured to focus light to nanoscale spot sizes and may employ negative index of refraction materials for focusing. The high-density storage media may include protein-based storage media, such as photochromic proteins, and high-coercivity magnetic storage media. Light energy provided the optical devices may enable exposed protein molecules to transition between stable molecular states that may be distinguished on the basis of their respective spectral maxima. Light energy provided by the optical device may also be used to heat localized regions of magnetic media to a selected temperature, effecting local changes in coercivity of the magnetic media. Information may be written to the magnetic storage media within this localized region using a magnetic recording device, while leaving the magnetic state of the remaining portion of the magnetic storage media unchanged.

17 Claims, 24 Drawing Sheets

NEAR FIELD OPTICAL RECORDING SYSTEM HAVING NEGATIVE INDEX OF REFRACTION STRUCTURE

CROSS-REFERENCE TO RELATED APPLICATIONS

This application claims the benefit of priority under 35 U.S.C. §119(e) of U.S. Provisional Application No. 61/082,105, filed on Jul. 18, 2008 and entitled, "NANOLASERS AND PROTEIN-BASED RECORDING MEDIUM," and U.S. Provisional Patent Application No. 61/147,042, filed on Jan. 23, 2009 and entitled, "ULTRA-HIGH DENSITY, MULTI-LEVEL HEAT ASSISTED MAGNETIC RECORDING." The entirety of each of these applications is incorporated herein by reference.

STATEMENT REGARDING FEDERALLY SPONSORED R&D

Embodiments of the present disclosure were made with Government Support under contract numbers H94003-07-2-0703 and H94003-06-2-0608 awarded by the Office of Naval Research/Defense Microelectronics Activity (ONR/DMEA), under Grant contract numbers ECS-0401297, ECS-0508218, ECS-0404308, and IIP-0712445 awarded by the National Science Foundation (NSF), under contract numbers FA9550-04-1-0446 and FA9550-05-1-0232 awarded by the U.S. Air Force Office of Scientific Research (AFOSR), and under contract numbers DOD/DMEA-H94003-07-2-0703 awarded by Defense MicroElectronics Activity (DMEA) and Office of Naval Research (ONR). The Government has certain rights in this invention.

BACKGROUND

1. Field

Embodiments of the present disclosure relate to systems and methods for high-density information storage, and more particularly, to systems and methods for reading and writing information to high density using optical devices capable of focusing light with high power to spot sizes less than 30 nm in diameter.

2. Description of the Related Art

The aerial disk recording density of magnetic media within modern hard disk drives has increased at a pace of tens of percents annually in recent years through a series of breakthroughs. For example, perpendicular recording, where magnetic bits are oriented substantially perpendicular to the disk platters, has made it possible to achieve storage densities on the order of about 0.5 Terabit per square inch (Tb/in$^2$) in prototype media.

It is believed, however, that such magnetic recording systems may face increasing difficulty progressing significantly beyond 1 Tb/in$^2$ densities. Notably, recording densities, even in perpendicular recording media, are substantially limited by the grains size of the ferromagnetic materials comprising the magnetic media. For example, it takes approximately 60-80 grains to compose a single bit which provides meaningful signal strength to overcome the noise created by randomness in the grain size and magnetization. Furthermore, reducing the volume of grains within the bits to further increase storage density may result in demagnetization by heat and loss of data.

Another problem facing the data storage industry pertains to the tools employed to read and write data to storage media. While advancements in technology may produce storage media having greater storage densities, present read/write technologies are not able to write and read data with sufficient resolution to fully take advantage of such media.

SUMMARY

In an embodiment, a near-field optical system for storing information to a high-density storage media is provided. The system comprises a light source in optical communication with a light focusing system. The light focusing system comprises a plurality of lenses operative to focus light received from the light source. The system further comprises a film formed on a terminal lens of the focusing system, where the film is configured with at least one aperture having a dimension less than about 100 nm. The system also comprises a negative index of refraction structure (NIR structure) positioned upon an air bearing surface of the film.

In another embodiment, a method of storing information to a protein-based storage media is provided. The method comprises providing a light source, providing a photochromic protein having at least two stable structures within its photocycle, providing first and second wavelengths of light from the light source to cause the photochromic protein to transition from a first stable structure to a second stable structure, and providing a third wavelength of light from the light source to cause the photochromic protein to transition from the second stable structure to the first stable structure.

In a further embodiment, a method of magnetically storing information is provided. The method comprises providing a light source, providing a magnetic recording media, heating a selected region of the magnetic recording media to a temperature within approximately 30% of the Curie point of the magnetic recording media using light output from the light source, and generating a magnetic field with a magnetic field generator that is sufficient to write information magnetically to the magnetic recording media within the selected region.

DETAILED DESCRIPTION OF CERTAIN INVENTIVE EMBODIMENTS

Figure 1:
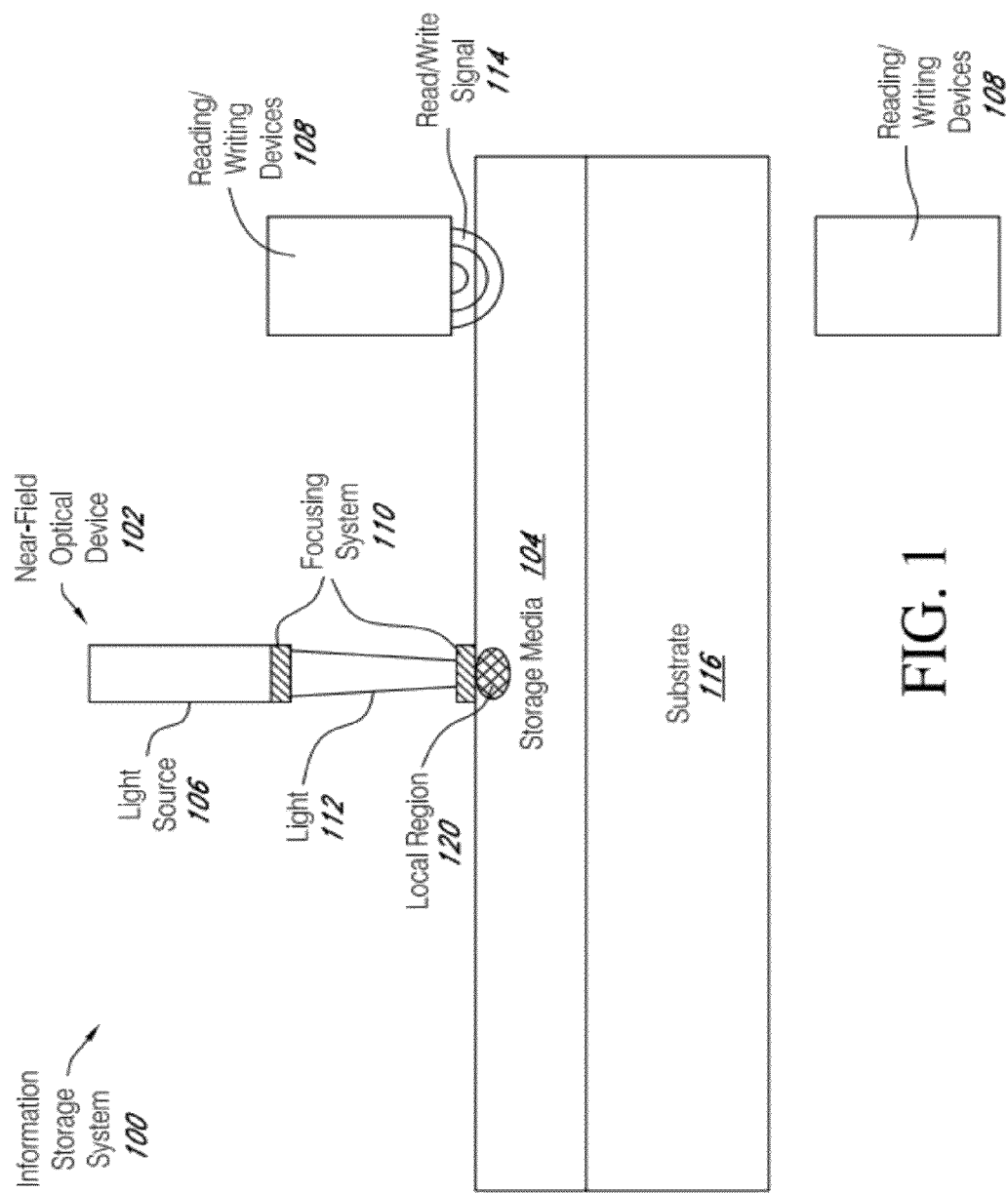
FIG. 1 is a schematic illustration of one embodiment of a information storage system comprising one or more near-field optical devices (e.g., nanolasers) capable of reading and writing information to high-density storage media at nanoscale resolution.

Embodiments of the present disclosure present systems and methods for high-density information storage. In one embodiment, storage is accomplished by the use of novel, near-field optical devices in combination with high-density storage media. The near-field optical devices are configured to focus light to nanoscale spot sizes (e.g., diameters less than about 100 nm) and are also referred to herein as nanolasers. The combination of optical power and high resolution afforded by these nanolasers enable writing and optionally reading of information to high-density storage media at previously unattainable resolutions, promising to deliver devices with areal densities beyond about 5-10 Tb/in$^2$.

As discussed in detail below, the nanolasers may comprise nanoscale apertures at the emitting edge. The apertures may include geometric shapes fabricated by focused ion beam (FIB) techniques or other etching techniques to generate light in the near-field regime in the vicinity of the emitting edge. The nanolaser may be further employed in conjunction with negative index of refraction (NIR) structures to refine the spot size of the emitted light. For example, NIR structures may be positioned at the air bearing surface of the nanolaser (e.g., the emitting edge), the air bearing surface of the high-density storage media, and combinations thereof.

In certain embodiments, nanolasers configured in this manner may provide light focused to spot sizes less than about 50 nm in diameter, less than about 30 nm in diameter, and less than about 10 nm in diameter. In an embodiment, light power over about 250 nW to 1 µW may be delivered into a spot size with a diameter less than about 50 nm. In an embodiment, light power less than about 250 nW (e.g., between about 100 to 250 nW) may be delivered into a spot size with a diameter less than about 30 nm. In another embodiment, light power less than about 100 nW (e.g., about 25 to 50) may be delivered into a spot size with a diameter less than about 10 nm.

To realize the functions of recording, storing, and retrieving information at the nanoscale, in an embodiment, the high-density storage media may comprise protein-based storage media, such as photochromic proteins. In protein-based storage media, the photocycle (photosynthesis) of photochromic proteins may be employed to store information. In the photocycle, each protein molecule goes through at least two relatively stable molecular states that are distinguishable from one other by different optical spectral maxima. To optically write information at the nanoscale, an embodiment of nanolaser may be employed to provide light at a selected wavelength incident upon the protein-based storage media. The light enables the protein molecules exposed to the light to transition between the stable molecular states. These states may subsequently be read and distinguished on the basis of their respective spectral maxima.

In an alternative embodiment, the high-density storage media may comprise a high-coercivity magnetic storage media. The high-coercivity magnetic media exhibits a local decrease in coercivity when heated to temperatures ranging from about 30% less than the Curie point of the magnetic media up to about the Curie point of the magnetic media. By employing embodiments of the nanolaser to heat the magnetic storage media, local changes in coercivity of the media, on the order of tens of nanometers, may be achieved. By further employing a small magnetic field generated by a magnetic recording device, information may be recorded to the magnetic storage media within this highly localized region, while leaving the magnetic state of the remaining portion of the magnetic storage media unchanged.

In further advantage, the high coercivity storage media may possess a relatively small grain size. For example, the grain size of the high coercivity magnetic material may be smaller than standard magnetic media (e.g., about 1 to 8 nm as compared to 8 to 16 nm. This relatively small grain size may enable information to be written to smaller bits, providing an increase in recording density. Furthermore, as the magnetic storage media possesses high coercivity at operating temperatures, signal to noise ratios sufficient to recover (e.g., read) the information written to the high coercivity magnetic storage media may be achieved, despite the small size of the bits.

This concept may also be extended to high-coercivity, multi-layered (e.g., three-dimensional or 3-D) magnetic storage media. The nanolaser may be configured to provide a substantially continuous variation in light output power, enabling recording on selected layers within the magnetic storage media, providing three-dimensional storage. For example, assuming the nanolaser is placed adjacent a top layer of a multi-level magnetic storage media, each layer of the multi-level magnetic storage media, starting from the top layer, may be continuously heated to reach its Curie temperature and information written to the layer once the Curie temperature is reached. In this manner, the layers of the multi-level magnetic storage media that are farthest from the nanolaser and a recording head may be accessed by employing the largest value of the power of the nanolaser. As a result, different layers across the thickness of the 3-D magnetic storage media may be accessed by increasing the local temperature, providing an effective increase in areal recording density. These and other advantages of the present disclosure are discussed in detail below.

FIG. 1 illustrates one embodiment of a information storage system 100 of the present disclosure. The system 100 may comprise one or more near-field optical devices or nanolasers 102, a high-density storage media 104, and, optionally, one or more reading and/or recording devices 108. One or more of the optical devices 102, storage media 104, and reading/recording device 108 may be mounted to one or more actuators (not shown) for positioning with respect to one another.

In one embodiment, the nanolasers 102 may comprise a light source 106 and a focusing system 110. In general, the diameter of the spot size of the focused light is proportional to the wavelength of the light generated by the light source. Therefore, light sources capable of providing light having relatively small wavelengths, for example, within the ultraviolet to visible range, may be employed to facilitate production of light having small spot sizes In certain embodiments, the light source 106 may comprise a laser. Examples of lasers may include, but are not limited to, semiconductor-based lasers (e.g, laser diodes), gas lasers, crystal lasers, and the like). In selected embodiments, laser diodes may be employed owing to their size and ease of integration with focusing systems. The nanolaser 102 may be configured to provide light 112 from the light source 106 and, by passing the light 112 through the focusing system 110, focus the light 112 onto a local region 120 of the storage media 104 for at least one of reading, writing, and erasing information from the storage media 104.

In certain embodiments, the reading/writing devices 108 may be capable of generating read/write signals 114 for reading and/or writing information to the storage media in conjunction with the nanolasers 102. For example, in the case of magnetic storage media, the reading/writing devices 108 may generate magnetic read/write signals 114 to read and write information to the magnetic media. In other embodiments, the reading/writing devices 108 may be operative to read signals generated by the nanolasers 102. For example, in protein-based storage media, the reading/writing devices 108 may operate as detectors to detect signals generated by the nanolasers 102 which are transmitted through or reflected from the protein-based media. The reading/writing devices 108 may be further positioned adjacent the storage media 104, adjacent the substrate 116, and combinations thereof.

As discussed in greater detail below, in embodiments of the storage media 104 based upon photochromic proteins, the incident light 112 may be employed to induce transitions between stable intermediate within the proteins and write information to the proteins. In alternative embodiments, where the storage media 104 is based upon high-anisotropy magnetic media, the incident light 112 may be employed to heat the local region 120 of the storage media 104 to a selected temperature (e.g., to about the Curie temperature of the storage media 104). The heating process may be employed to lower the local coercivity of the media and, in conjunction with one or more reading/writing devices 112 which generate read/write signals 114 such as magnetic fields, to record information to the storage media 104.

The storage media 104 may be further positioned upon a substrate 116 configured to support the storage media 104. The substrate may comprise materials including, but not limited to, glass, as well as Si, Al, and Al alloys.

Figure 2A:
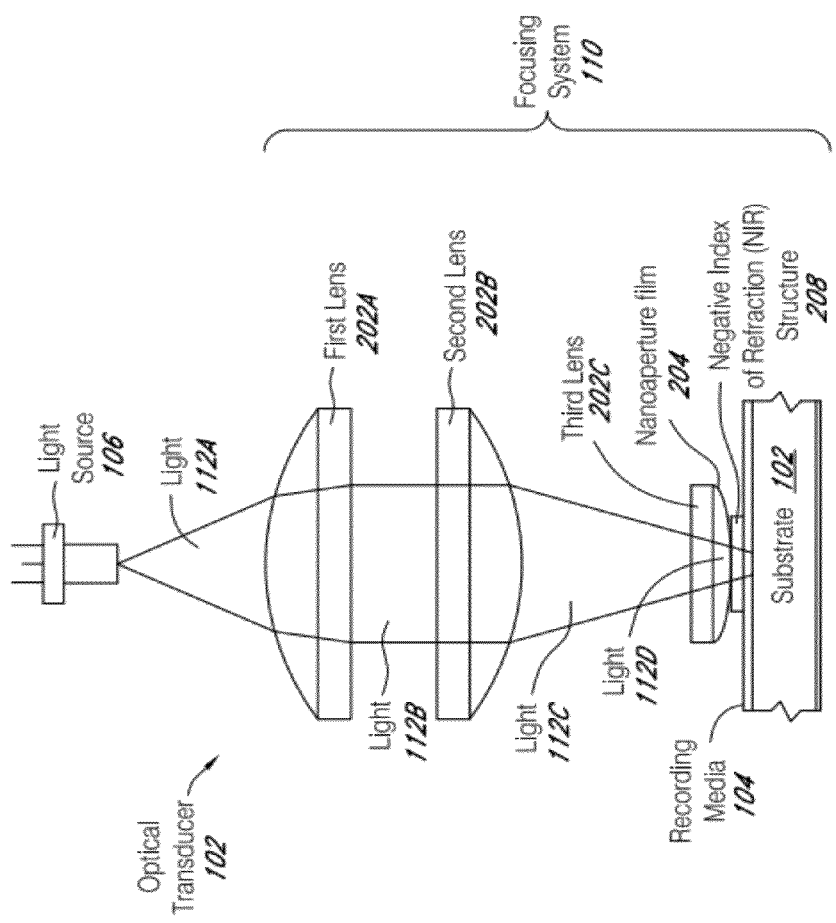
FIG. 2A is a schematic illustration of an embodiment of a light focusing system of the near-field optical devices of FIG. 1.
Figure 2C:
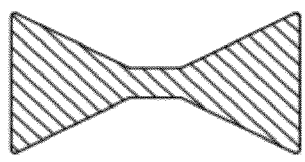
FIGS. 2B-2E are schematic illustrations of embodiments of aperture geometries that may be employed by the near-field optical devices of FIG. 1 for focusing.
Figure 2E:
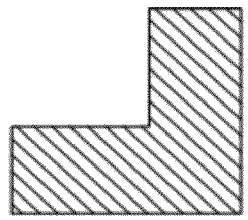
Figure 2B:
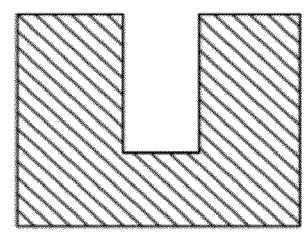
Figure 2D:
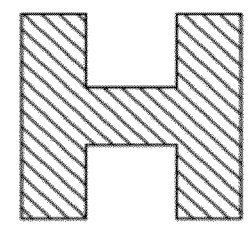

FIG. 2A is a schematic illustration of an embodiment of the nanolaser 102, illustrating the focusing system 110 in greater detail. When light 112A emerges from the light source 106, it may impinge upon the focusing system 110, which may comprise a plurality of lenses, for example, 202A, 202B, and 202C and a negative index of refraction (NIR) structure 208. In certain embodiments, lenses 202A, 202B, and 202C may be formed from fused silica and may possess a fracture toughness greater than about 2.5 J/cm². Additionally, lenses 202A and 202B may be substantially plano-convex, while lens 202C may be a high-precision glass window having a diameter of approximately 100 to 500 μm.

Light 112A impinging the first lens 202A exits the first lens 202A as collimated light 112B and is directed towards the second lens 202B. The second lens 202B focuses the incident collimated light 112B to a diffraction limited spot, light 112C, having a diameter ranging between about 0.4 to 1.2 μm upon an air-bearing surface of the third lens 202C. The lens 202C may be coated with a film 204 having nanoscale apertures. By passing the light 112C through third lens 202C and the nanoaperture film 204, the light 112C may be further focused to a spot size less than about 50 nm in diameter (light 112D) in the extreme near field regime of lens 204.

In certain embodiments, a negative index of refraction (NIR) structure 208 may be further placed upon the nanoaperture film 204. By passing the light 112C through the third lens 202C, the nanoaperture film 204, and the NIR structure 208, the light 112C may be further focused to a spot size less than about 50 nm in diameter, less than about 30 nm in diameter, and less than about 10 nm in diameter (light 112D) in the extreme near field regime of lens 204. In alternative embodiments, light focused to such spot sizes may be achieved by placing the NIR structure 208 upon an air bearing surface of the storage media 104 in lieu of placement on the nanoaperture film 204. In further alternative embodiments, the NIR structure 208 may be placed upon both the nanoaperture film 204 and upon the air bearing surface of the storage media 104.

The nanoaperture film 204 may be fabricated by deposition of a metallic coating upon the third lens 202C and removal of a portion of the coating to form the aperture. Metallic materials suitable for the nanoaperture film 204 may include, but are not limited to, aluminum, gold, silver, chromium, and alloys thereof. Methods of depositing the nanoaperture film 204 may also include, but are not limited to electron beam deposition, sputtering, vapor deposition, molecular beam epitaxy, and the like. The thickness of the nanoaperture film 204 may be varied between approximately 50 to 300 nm.

The aperture may comprise one or more apertures having one or more of a variety of shapes, as illustrated in FIGS. 2B-2E. In certain embodiments, the apertures may comprise a C-shape (FIG. 2B), an hourglass shape (FIG. 2C), an H-shape (FIG. 2D), an L-shape (FIG. 2E), and combinations thereof. The largest dimension of the apertures may range between about 10 to 220 nm. In certain embodiments, the largest dimension of the effective aperture may be approximately 65 nm.

The apertures may be introduced into the nanoaperture film 204 by employing a small-scale machining process that is capable of producing features in a metallic film at the nanometer scale. Examples may include, but are not limited to, chemical etching post electron beam lithography, and focused ion beam (FIB) milling. The performance of embodiments of the nanolasers employing the FIB fabricated nanolasers with and without NIR materials are discussed below in example 1.

In an embodiment, the NIR structure 208 may comprise a plurality of dielectric and metal layers. In an non-limiting embodiment, the NIR structure 208 may comprise a dielectric-metal-dielectric-metal layer structure. Such structures may be formed by depositing the dielectric and metal layers upon a selected surface in selected thicknesses. Examples of the dielectric layers may include magnesium fluoride ($MgF_2$), and silica The thickness of the dielectric layers may range between about 10 to 50 nm. The thickness of the metal layers may range between about 30 to 60 nm. Examples of the metal may include, but are not limited to, Silver, Gold, and Aluminum. The total thickness of the NIR structure 208 may range between about 50 to 150 nm.

The thickness (pitch) of the layers may determine the resonance frequency of the structure. For example, resonant frequencies ranging between about 400 to 600 THz may be achieved. An example of an NIR structure having a resonant frequency of about 780 nm wavelength may be found in Dolling, et al., Optics Letters, "Negative-index metamaterial at 780 nm wavelength," Vol 32, No 1, (2007), the entirety of which is hereby incorporated by reference.

In certain embodiments, the nanolaser 102 may be integrated within a single laser diode package by replacing the lenses 202A, 202B, 202C illustrated in FIG. 2A with lenses that are built into the emitting edge of the light source 106. In certain embodiments, numerical models have found such focusing configurations to further improve the power transmission efficiency of the nanolaser by approximately two orders of magnitude, as compared with free-standing lenses.

Having described the nanolaser 102, embodiments of high-density storage media 104, including protein based storage media and high-anisotropy magnetic media Protein-Based Storage Media Embodiments of the nanolaser 102 may be employed in conjunction with protein-based storage media, such as photochromic proteins. Embodiments of the photochromic proteins may include, but are not limited to, bacteriorhodopsin (BR). Examples of BR may include, but are not limited to, naturally evolved (wild-form) BR and genetically engineered adaptations (BR-mutants).

Such protein molecules exhibit properties which may be superior to magnetic media employed in hard drives. For example, the BR molecule possesses a diameter of about 2 nm, which may be utilized for information storage with areal densities beyond about 10 terabit/$inch^2$. Additionally, BR exhibits long-term stability, with a shelf life of at least about 10 years at room temperature. Furthermore, the BR molecule is believed to be stable up to temperatures of about 140° C. In contrast, magnetic Co-based grains used in the best hard drives today become highly unstable if the average grain size is reduced below about 3 nm. Among other advantages of protein-based storage media include relatively good recyclability and faster response times (picosecond response times for proteins as compared to nanosecond response times in magnetic media). Structural and physiological features of BR as pertaining to protein-based media are discussed below.

Figure 3:
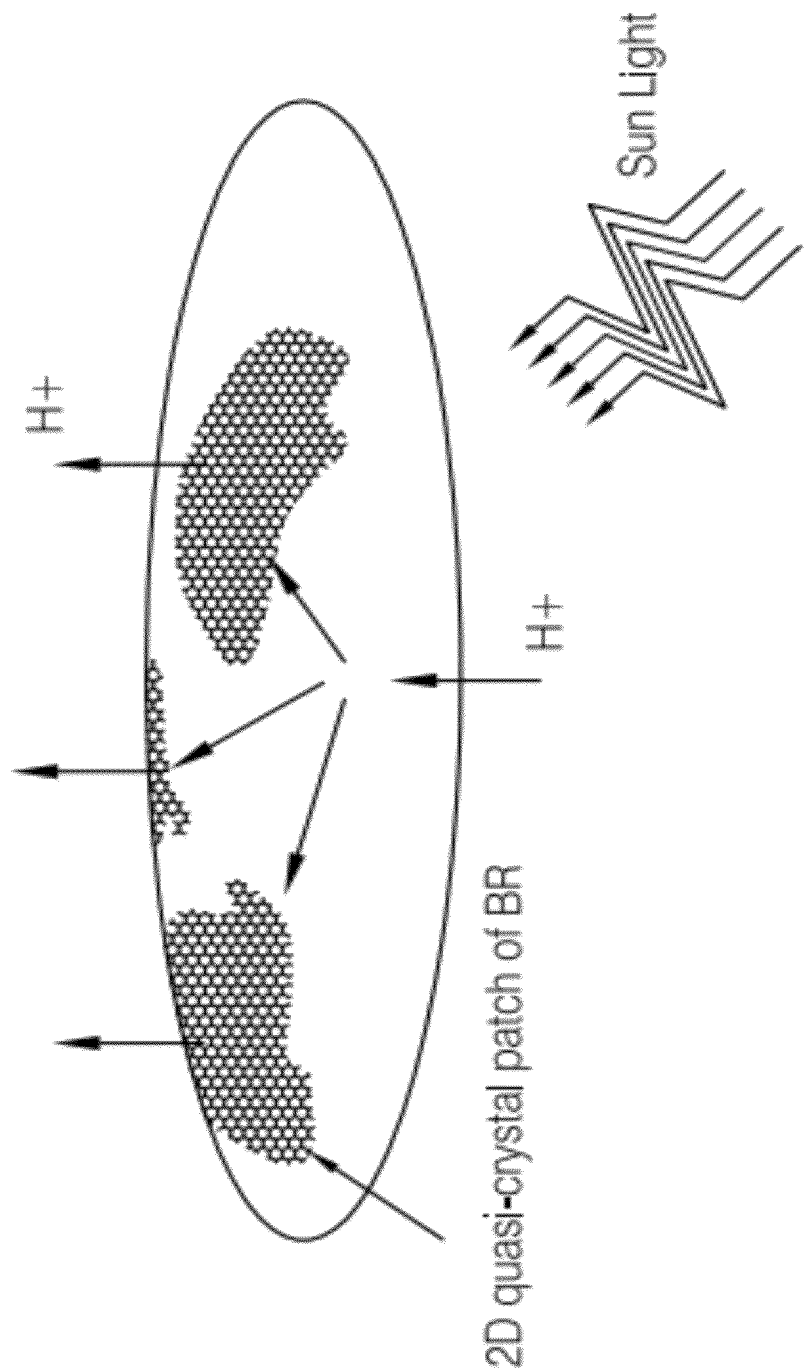
FIG. 3 is a schematic illustration of one embodiment of a halobacterial cell covered with patches of self-assembled two-dimensional arrays of bacteriorhodopsin (BR) molecules showing the light-driving proton pumping process.

BR may be found in the form of two-dimensional (2D) crystal patches integrated into a cell membrane (e.g., halobacterial cell), as illustrated in FIG. 3. Each patch is a self-assembled array of several BR molecules. The inclination of the molecules of BR to self-assemble into a crystal lattice explains the protein's unique stability. While the stability of the protein is determined by the collective assembly, unique optical properties of BR are inherent to individual molecules. In one embodiment, diameter of a BR molecule may be about 2 nm. Each molecule acts as a light-driven proton pump with an efficiency of approximately sixty percent. Such high efficiency implies that only less than two photons of light are necessary to trigger each proton-pumping process.

Figure 4A:
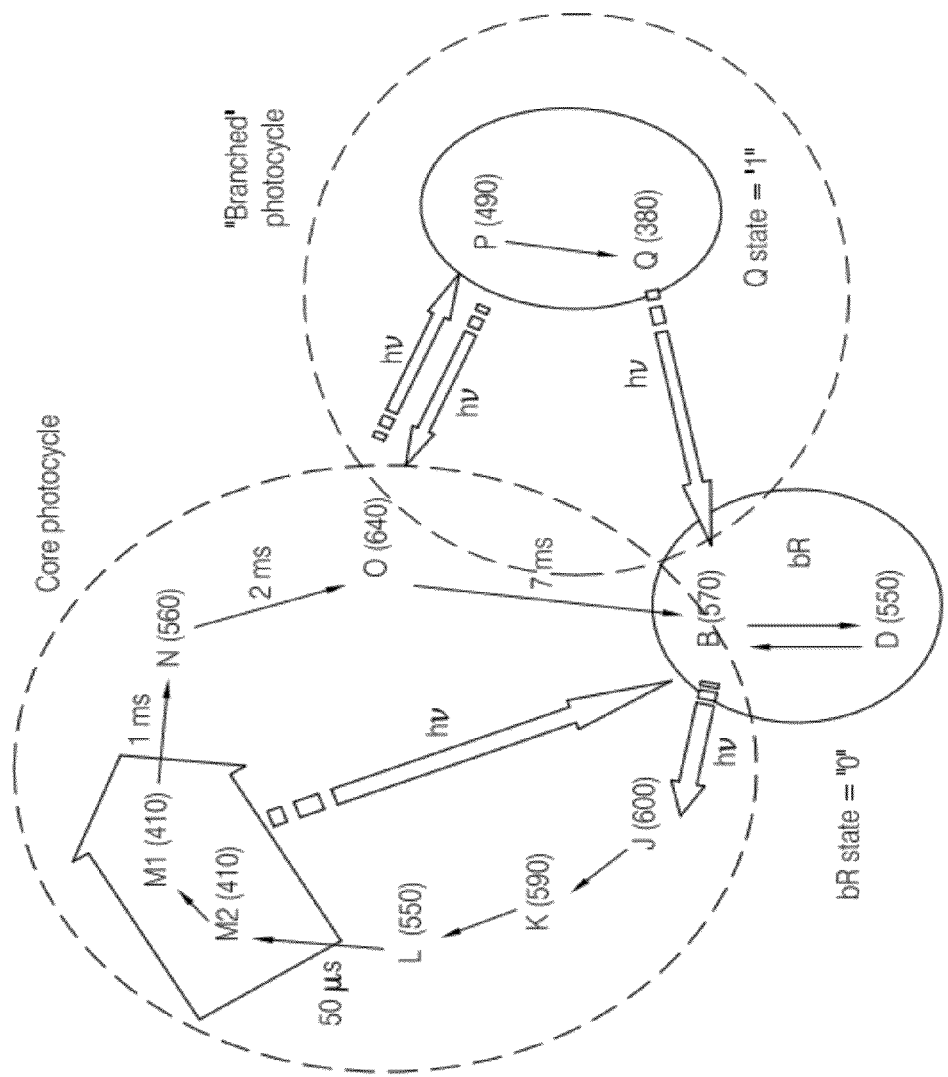
FIG. 4A is a schematic illustration of one embodiment of a photocycle of bacteriorhodopsin (BR) at about room temperature.

When bacteriorhodopsin absorbs a photon of light, the bacteriorhodopsin passes through a cycle of structural changes. One result of the changes is the isomerization from all-trans to 13-cis of the retinal chromophore bound at Lys-216. Each change in the molecular structure may be referred to as an intermediate. FIG. 4A shows the intermediates in the photocycle of BR at room temperature with capital letters. For example, intermediates labeled D, B, J, K, L, M2, M1, N, O, P, and Q are illustrated. The numbers in parenthesis indicate the wavelengths, in nanometers, of the absorption maxima, respectively, of each illustrated intermediate.

Thin arrows are also shown in FIG. 4A. These arrows indicate the transitions between the respective intermediates via thermal fluctuations, while thicker arrows reflect the photochemically induced transitions. Each thicker arrow represents the color of the excitation frequency. It may be appreciated that these conformational, light-induced changes are also temperature dependent.

The temperature dependence of the bacteriorhodopsin may also imply that an intermediate can be substantially stabilized at a selected temperatures, usually below about −10 degrees Celsius, which is specific to each intermediate. At temperatures below the stabilization temperature, the transition to the next intermediate may become inhibited. The characteristic relaxation times, or lifetimes, of some of the intermediates at room temperature are also shown next to the respective thin arrows. The photocycle with intermediates can be treated as a state diagram with intermediates presented as states. Each intermediate has its own absorption spectrum and thus intermediates or states can be optically distinguished from each other.

Figure 4B:
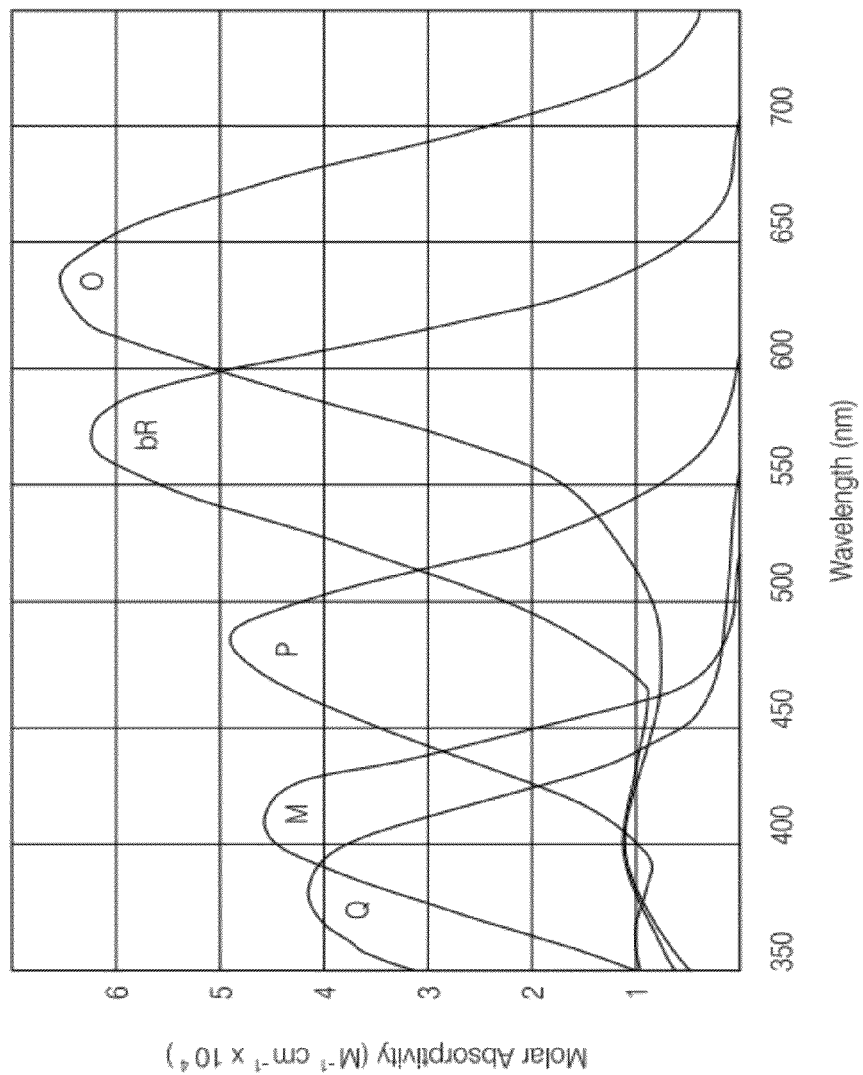
FIG. 4B is a schematic illustration of embodiments of an absorption spectra of five states of bacteriorhodopsin, bR, M, O, P, and Q.

The characteristic absorption spectra of five states, bR, M, O, P, Q, respectively intermediates of BR at room temperature, are shown in FIG. 4B. In one embodiment, all the transitions, except for the transition from the state M2 to M1, may be reversible. During the transition from M2 to M1, the irreversible process of proton pumping takes place. Specific properties of the photocycles of BR are discussed in further detail below.

The photocycle of BR may comprise several branches. The two most significant branches are referred to as the core and branched photocycles. During normal function, a BR molecule remains in the core photocycle, while the intermediates in the branched photocycle are generally not populated at physiological conditions. As described below, in order to induce the BR molecule to enter into the branched photocycle, the protein may be exposed to a certain sequence of light.

In general, the ground state of BR, referred to as the bR-state, comprises an approximately 6:4 mixture of the D and B intermediates, respectively. Upon exposure by light, substantially all the protein transitions from the D into the B intermediate. From there, bR transitions into the core photocycle, as illustrated in FIG. 4A.

In the core photocycle, transitions between any two adjacent intermediates may be reversible, with the exception of the transition from the M2 to M1 intermediates. The transition from M2 to M1 may be responsible for the irreversible proton transport during the photocycle (deprotonation and reprotonation). It should be noted that, as the M2 and M1 intermediates have practically undistinguishable absorption spectra, the combination of M2 and M1 is often referred to as the M-state.

In an embodiment, the core photocycle may be used for dynamic volatile memory applications, such as random access memory (RAM), devices for fast non-destructive optical processing, and others, for example. In this case, the ground state (bR) and the complex M-state may be used as the two binary states, such as 0 and 1, respectively. The lifetime of the M-state at room temperature may vary from approximately a second for naturally evolving wild type or wild form BR to a few minutes for certain variants of BR (e.g. D96N) and others.

The branched photocycle may also be employed for long-term (non-volatile) protein-based storage. In this case, the two binary states (i.e. 0 and 1) may be represented by the ground state (bR) and either of the P or Q intermediates in the branched cycle. The branched photocycle originates at the O intermediate (i.e. after the deprotonation took place). When the protein is illuminated by light of wavelengths ranging between about 600 to 645 nm, (e.g., red light) it branches off from O to P. Then, the protein thermally converts from P to Q. The Q intermediate is isolated from the core photocycle by a relatively large energy gap, which underlies the non-volatile memory application of BR. To transition from Q back to the bR state in the core photocycle, the protein is exposed to light of wavelengths ranging between about 390 to 440 nm (e.g., blue light). The process may result in reisomerization of the chromophore to substantially all-trans and the protein returning to the ground (bR) state. As illustrated in FIG. 4B, the bR state and the Q intermediate state have quite different absorption spectra and thus may be optically distinguished.

The characteristic time of the optically induced transitions between certain intermediates may, in certain embodiments, be on the order of a few picoseconds. This time duration may imply that the limit of the data rate in a protein-based system may be substantially higher than for magnetic or semiconducting technologies. Thus, unlike magnetic recording, protein-based disk recording does not have the storage media limited data rates. In other words, the data rates may be limited by the mechanical components and the data channel electronics of the drive.

Figure 5:
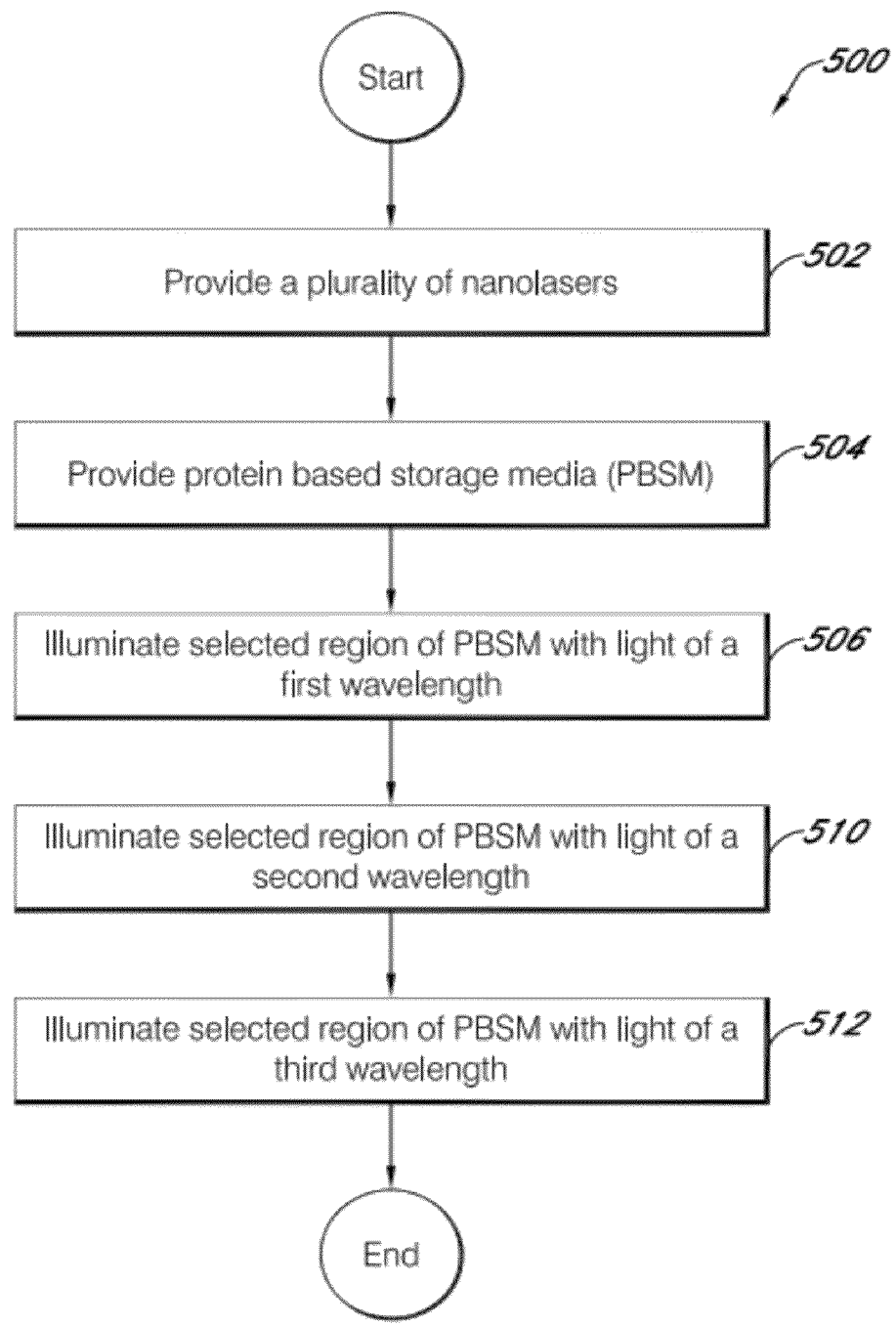
FIG. 5 is a flow diagram of one embodiment of a method for storing information within a protein-based storage media.

FIG. 5 illustrates one embodiment of a method 500 for writing information to protein-based storage media employing a plurality of nanolasers 102. The plurality of nanolasers may be configured to provide light having frequencies which to match the photocycle of BR (e.g., the photocycles, bR, M, O, P, and Q, of BR). Advantageously, by employing two different frequencies, the writing and reading processes do not interfere with one another. In additional embodiments, more than two nanolasers may be utilized to increase the signal to noise ratio (SNR). In certain embodiments, at least two nanolasers 102 may be employed to record and read from the protein-based media. The use of at least two nanolasers provides a mechanism by which to differentiate between reading and writing processes. In alternative embodiments, a single nanolaser configured to provide the functionality of multiple nanolasers may be employed.

Figure 6:
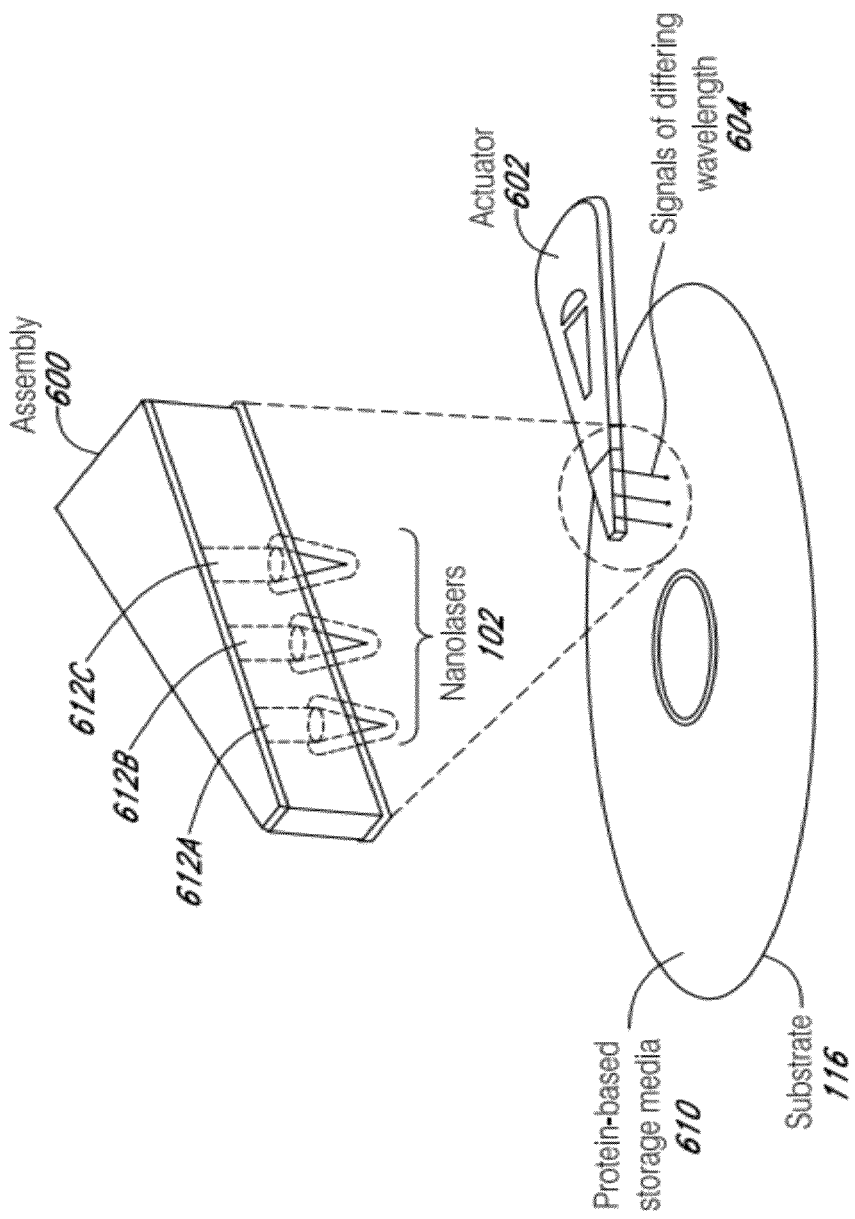
FIG. 6 is a schematic illustration of one embodiment of a system for writing information to protein-based storage media employing embodiments of the near-field optical devices of FIG. 1.

In blocks 502-504 of the method, an plurality of nanolasers and a protein based storage media may be provided. A schematic illustration of one embodiment of an assembly 600 comprising a plurality of nanolasers and protein based storage media 610 is illustrated in FIG. 6. In an embodiment, the assembly 600 may comprise one or more nanolasers 102 as discussed above with respect to FIG. 1, mounted to an actuator 602, enabling positioning of the assembly 600 above the protein based storage media 610. For example, as illustrated in FIG. 6, three nanolasers, 612A, 612B, and 612C may be provided, each capable of providing light at a different wavelength. However, one of skill in the art may understand that the functionality of one or more of the nanolasers, 612A, 612B, and 612C may be combined into a single nanolaser.

In certain embodiments, the protein based storage media 610 may be placed upon a substrate 116, such as those described above with respect to FIG. 1. In further embodiments, the substrate 116 and protein-based media 610 may be employed in a configuration similar to a magnetic or optical recording disk. The thickness of the protein-based storage media 610 upon the substrate 116 may range between about 0.05 to 0.1 µm. Information stored to the protein-based media may be further organized in tracks.

To enable non-volatile information storage, the branched photocycle of the may be used, with the binary state 0 as the bR (ground) state (in the core photocycle) and the binary state and 1 as either of the P and Q intermediates, (in the branched photocycle). Therefore, to record information into a protein-based storage media, two wavelengths, green and red, respectively, may be used. Green light (e.g., wavelengths between about 490 to 530 nm) may be used to convert the protein from the bR state to the O intermediate. The red light (e.g., wavelengths between about 600 to 645 nm) may be used to convert BR from O to the P intermediate in the branched photocycle, from where it thermally transitions into the stable Q intermediate. This two-step mechanism may be employed to write information to in protein-based storage media, as discussed below.

Figure 7A:
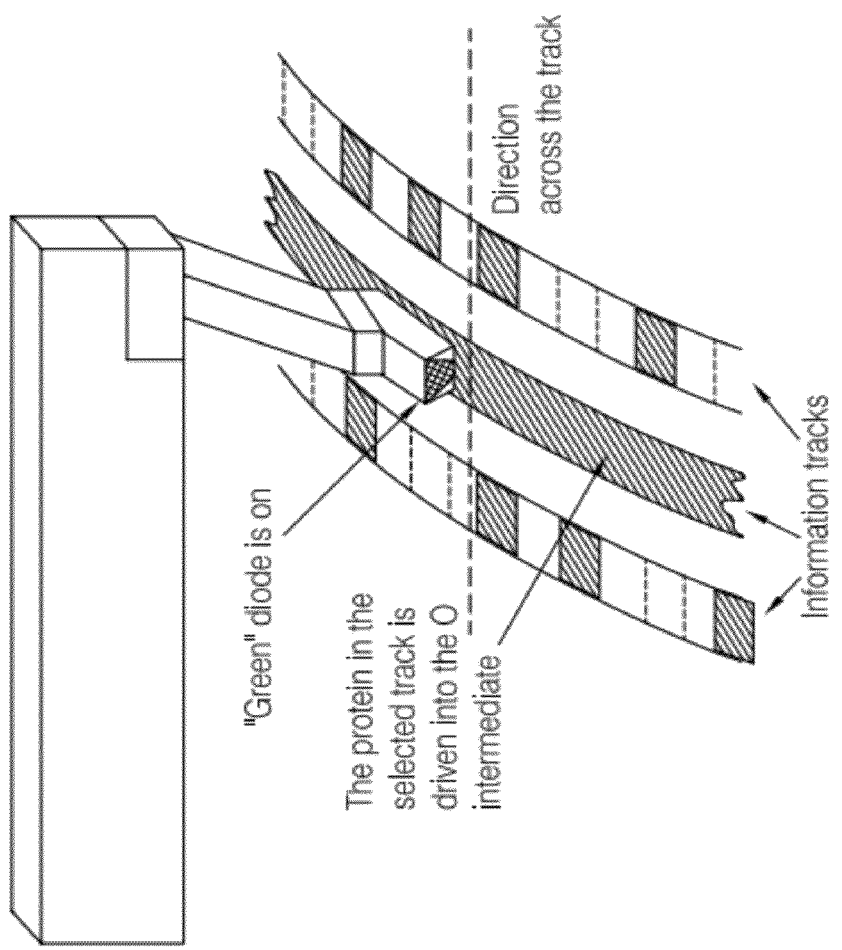
FIG. 7A is a schematic illustration of one embodiment of a selected region or track of a protein-based storage media exposed to a first wavelength of light (e.g., green light) in order to drive the protein in this region from a ground state (e.g., the bR-state) to a first intermediate structure (e.g., the O intermediate)
Figure 7B:
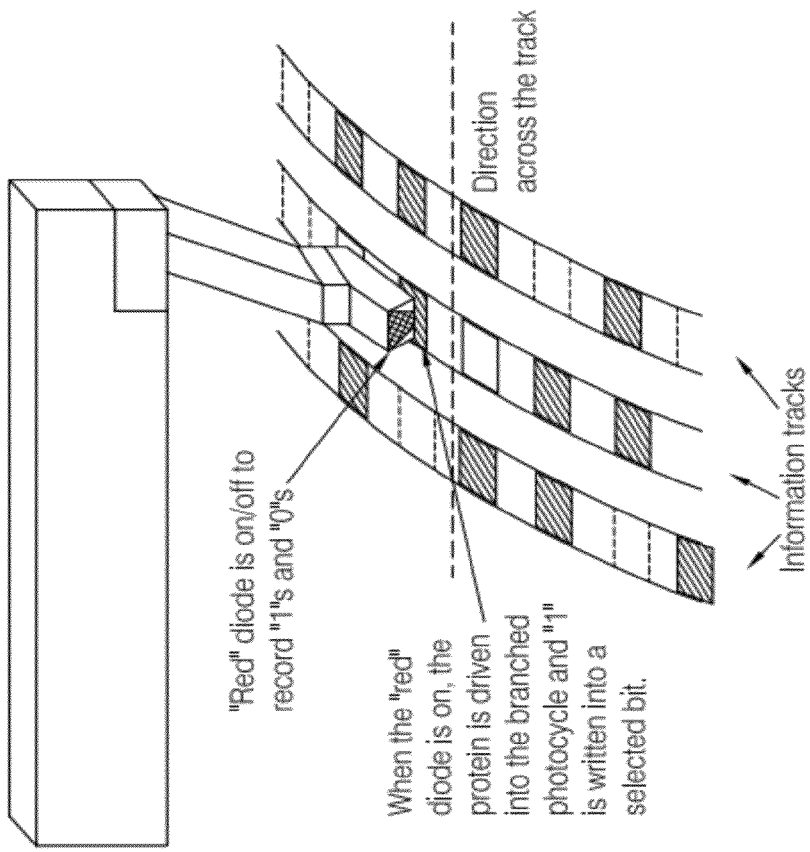
FIG. 7B is a schematic illustration of one embodiment of a selected region or track of a protein-based storage media exposed to a second wavelength of light (e.g., red light) after the first wavelength of light in order to drive the protein in this region to a second intermediate structure (e.g., the P or Q intermediate) which is employed for information storage.
Figure 7C:
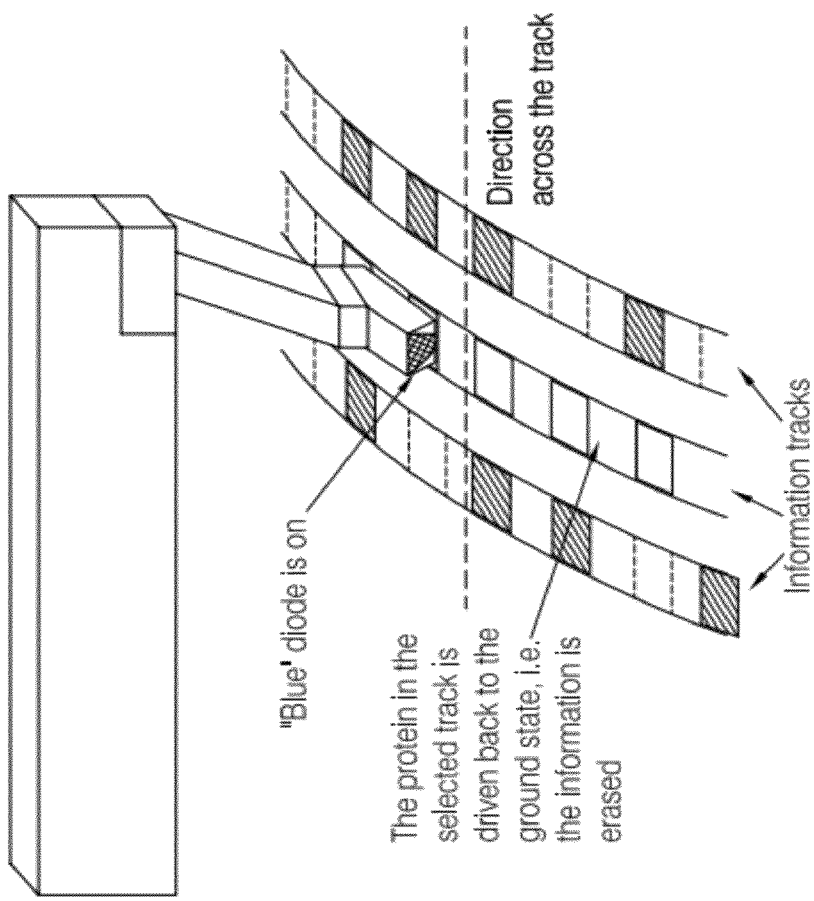
FIG. 7C is a schematic illustration of one embodiment of a selected region or track of a protein-based storage media exposed to a third wavelength of light (e.g., blue light) after the protein is in the second intermediate structure in order to drive the protein in this region from the second intermediate structure back to the ground state to erase information stored in the selected region.

Information may be written to the protein based storage media 610 in blocks 506-512 of the method 500. A corresponding, non-limiting schematic illustration of the writing process is shown in FIGS. 7A-7C. FIGS. 7A-C schematically illustrate a two-step write mechanism with the assembly 600 comprising with three nanolasers 612A, 612B, and 612C operating at red, green, and blue wavelengths, respectively.

In block 506 of the method 500, a selected region of the protein-based storage media 610 (e.g., a selected track) may be exposed to a first wavelength of light as a first part of the process of writing information to the storage media. In an embodiment, the first wavelength of light may comprise green wavelengths of light, (e.g., wavelengths ranging between about 490 to 530 nm). Exposure to the light drives the protein in this selected region to the O intermediate. In one embodiment, it may take approximately 3 ms to rotate the disk once and thus record over an entire track.

In block 510 of the method 500, the selected region of the protein-based media 610 may be exposed to light of a second wavelength in order to complete the process of storing information to the protein-based storage media 610. In an embodiment, the second wavelength of light may comprise red wavelengths of light, (e.g., wavelengths ranging between about 600 to 645 nm). For example, as illustrated in FIG. 7B, the information may be recorded by turning on and off the nanolaser providing light of red wavelengths. If one or more molecules comprising are exposed to the red light, the protein in this region transitions into the branched photocycle and the binary 1 is recorded in the bit. Otherwise, with the red light off, the binary 0 remains written in the bit.

In one embodiment, the relaxation time of the O intermediate may be on the order of about 7 msec, which is longer than the period of the disk rotation of about 3 msec. To further increase the efficiency of the recording process, faster rotation of the disk may be preferable. To maintain an adequate temporal separation between the two photon absorption events, it may be necessary to spin the disk in the idle mode (with all three diodes being "off") for one or more rotations before the second-step photons are fired.

In block 512, the selected region of the protein-based media may be exposed to light of a third wavelength in order to erase previously stored information. In an embodiment, the third wavelength of light may comprise blue wavelengths of light, such as ultraviolet light (e.g., wavelengths ranging between about 390 to 440 nm). For example, as illustrated in FIG. 8C, when the nanolaser providing the blue light is on, the information in the molecule is erased. In other words, the protein in the molecule converts back to the ground state (i.e. the binary 0 state). It may be appreciated that the color of the light may depend on the frequency and/or wavelength of the light.

Figure 8A:
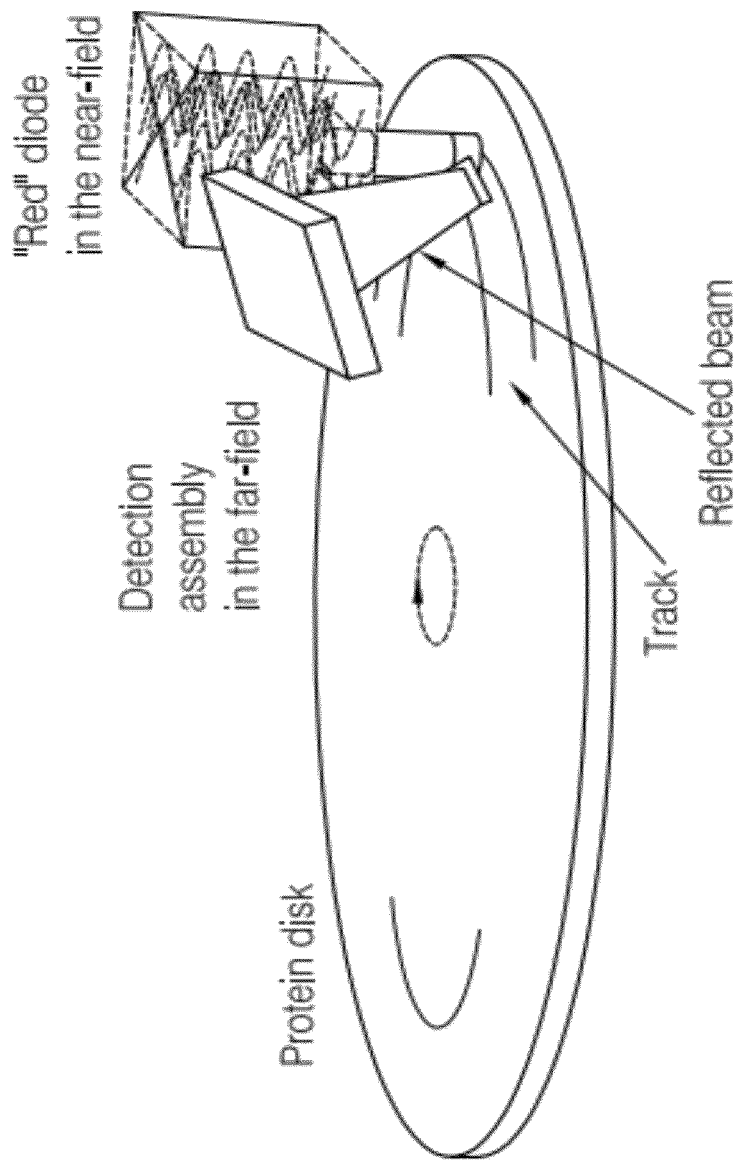
FIGS. 8A-8B illustrates embodiments of reading information from a protein-based storage media in a reflection mode (A) and transmission mode (B) employing an embodiment of the near-field optical devices of FIG. 1.

As further illustrated in FIG. 8A, a certain track on a disc comprising the protein-based storage media 610 can be selected/paged through the exposure to the green light. In this case, the nanolaser providing the green light may be activated for the duration of about one disc rotation. In one embodiment, the characteristic time for the rotation period is in the range of a few milliseconds, depending on the rotation rate. For example, it may take about 3 msec for a disc rotating at a rate of about 20,000 rotations per minute (rpm). As a result of this exposure, the protein along the selected (paged) track may be driven to the O intermediate, as shown in FIG. 8A.

Beneficially, it may be appreciated that the nanolasers 102 do not employ wavelengths which would directly interact with either the P or Q intermediate. Therefore, the described write scheme may be non-destructive with respect to any previously written information. It may be appreciated that the uncontrollable erasure by stray field or the field generated by a part of the recording head is one of the most critical issues in modern magnetic recording systems.

Having discussed methods for writing and erasing information in protein based storage media, methods of reading information stored in protein-based storage media will now be addressed. In one embodiment, information may be read from the protein-based storage media by absorption measurements. In alternative embodiments, information may be read from the protein-based storage media by fluorescence measurements. For example, the difference between the two binary states may be detected by the difference in absorption maximum and/or the amount of fluorescence, respectively, as described below. In both cases, a signal could be detected either in the far-field or near-field mode.

In the far-field detection case, the light emitted by the source in the near-field regime may be transmitted through or reflected by the sample. Then, the reflected or transmitted light, respectively, may be collected in the far-field regime. The resolution of the detection system in the far-field regime strongly depends on two factors: 1) the separation distance between the sample and the near-field source and 2) the power emitted by the near-field source.

Figure 8B:
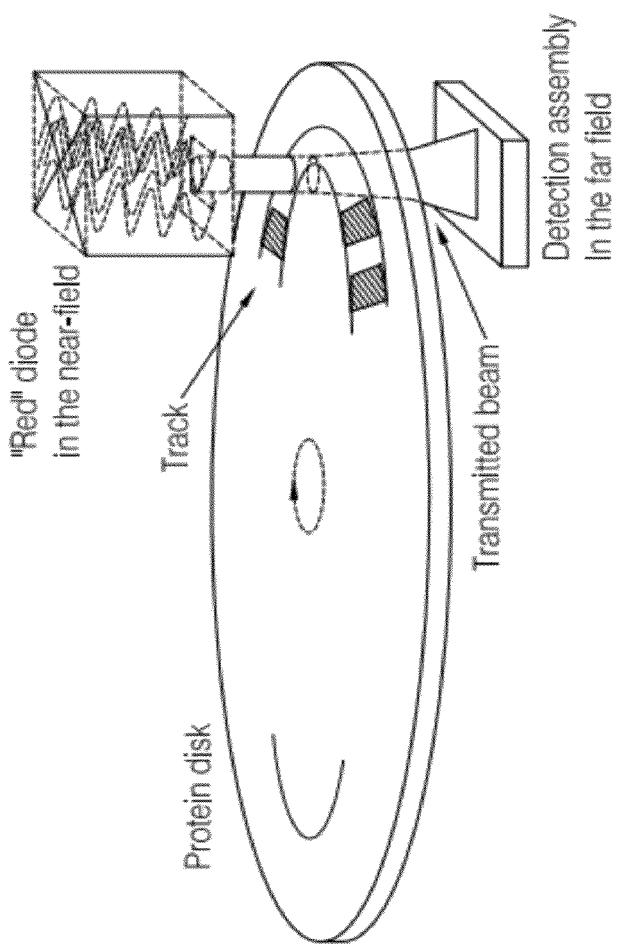

The nanolasers presently disclosed herein may provide power sufficient for use as a near field source. FIGS. 8A and 8B are schematic illustrations of embodiments of the implementation of reading a protein-based storage media in the reflection and transmission modes, respectively, in conjunction with the nanolasers of the present disclosure.

As the intermediate bR and P/Q states of BR have quite different absorption maxima, as shown in FIG. 4B, the read signal may be chosen to be either the reflected or transmitted power in the far-field, as shown in FIG. 8A and FIG. 8B, respectively. For example, if a nanolaser providing red light with a wavelength of about 600 to 640 (e.g., about 593 nm) is used as the source in the near-field, then the signal detected by the detection assembly (for example, reading/writing devices 108), which needs to operate at the same wavelength of about 593 nm, will depend on whether the protein in the bit region is in the bR or P/Q state. Because, the bR state will absorb substantially more signal, the detected reflected or transmitted signal will be smaller for the bR state, the binary 0, as compared to the P/Q state, the binary 1. Also, the use of the branched photocycle provides a substantially non-destructive read-out. To further enhance the signal, the substrates employed for support of the protein-based storage media can be made to be opaque and reflective for the cases of reflection and transmission, respectively.

It may be appreciated that reading through the measurement of fluorescence could be more efficient, for example, providing a factor of two increase in SNR as compared to reading through the measurement of absorption. It may be further appreciated that shot noise may be considered as the main source of noise because of the finite number of photons involved in the read process. The shot noise may be valid for measurements with conventional SNOM system that operate with inadequately low power values (of the order of a fraction of nW, when over 100 nW is required to achieve SNR of above 15 dB). In certain embodiments, substantially higher power values may be used thus causing the relative contribution to the SNR of the shot noise to be greatly diminished.

In one embodiment, in the case of fluorescence measurements, the detection assembly may operate at about the characteristic wavelength of the fluorescent light and not necessarily at the wavelength of the source in the near field. In one embodiment, fluorescence detection may be performed in the range from about ultra-violet to red light wavelengths (e.g. about 150 to 650 nm). When excited by a near-field source at a about certain wavelength, an intermediate of BR undergoes a certain excitation and relaxation sequence, which in turn triggers fluorescence with a certain wavelength spectrum. It may be appreciated that different intermediates have different fluorescence spectra and therefore may not be distinguishable from one another. Thus, the detection assembly may be chosen to function at an independent wavelength at which the difference in the amount of fluorescence between the two binary states of BR is at its maximum.

High-Density Magnetic Storage Media

In other embodiments, the storage media 104 may alternatively comprise a high coercivity, high-density magnetic storage media. The magnetic storage media may possess a selected coercivity and/or Curie temperature. For example, in certain embodiments, the coercivity of magnetic layers 124 may range between about 500 to 80,000 Oe. In other embodiments, the Curie temperature of the magnetic storage media 900B may vary between about 300 to 800° C. In other embodiments, the magnetic storage media may also possess a selected magnetization orientation. Examples of the magnetization orientation may include orientations substantially parallel to the surface of the substrate 116, substantially perpendicular to the surface of the substrate 116, and orientations there between.

Figure 9B:
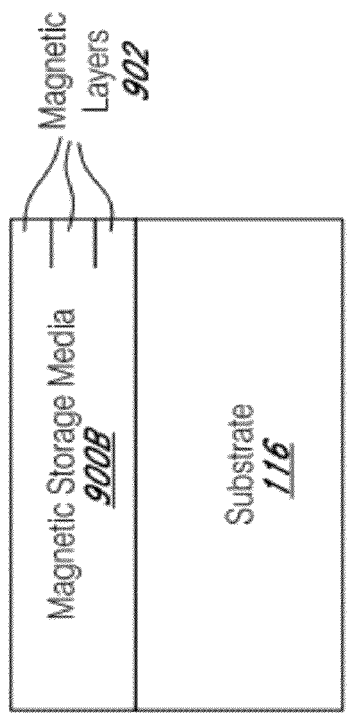
FIGS. 9A and 9B are schematic illustrations of magnetic storage media of the present disclosure; (A) single-layered magnetic storage media; (B) multi-layered magnetic storage media.
Figure 9A:
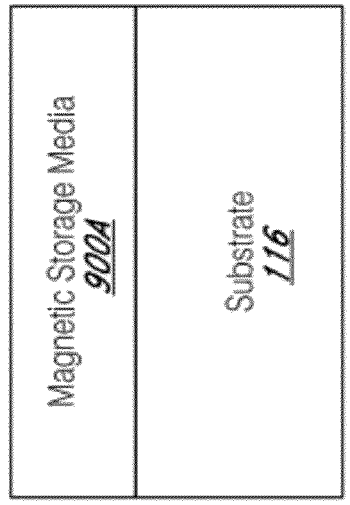

As illustrated in FIGS. 9A and 9B, the magnetic storage media may comprise a single-layered of magnetic storage material 900A or a multi-layered magnetic storage material 900B (collectively referred to as magnetic storage media 900). The multi-layered magnetic storage material 900B may comprise a plurality of quantum mechanically decoupled or weakly coupled layers 902 of the magnetic storage material. In embodiments of the magnetic storage media 900 comprising a plurality of layers of magnetic storage media, the properties of each layer (e.g., coercivity, Curie temperature, and magnetization orientation) may be independently varied with respect to others.

Figure 10A:
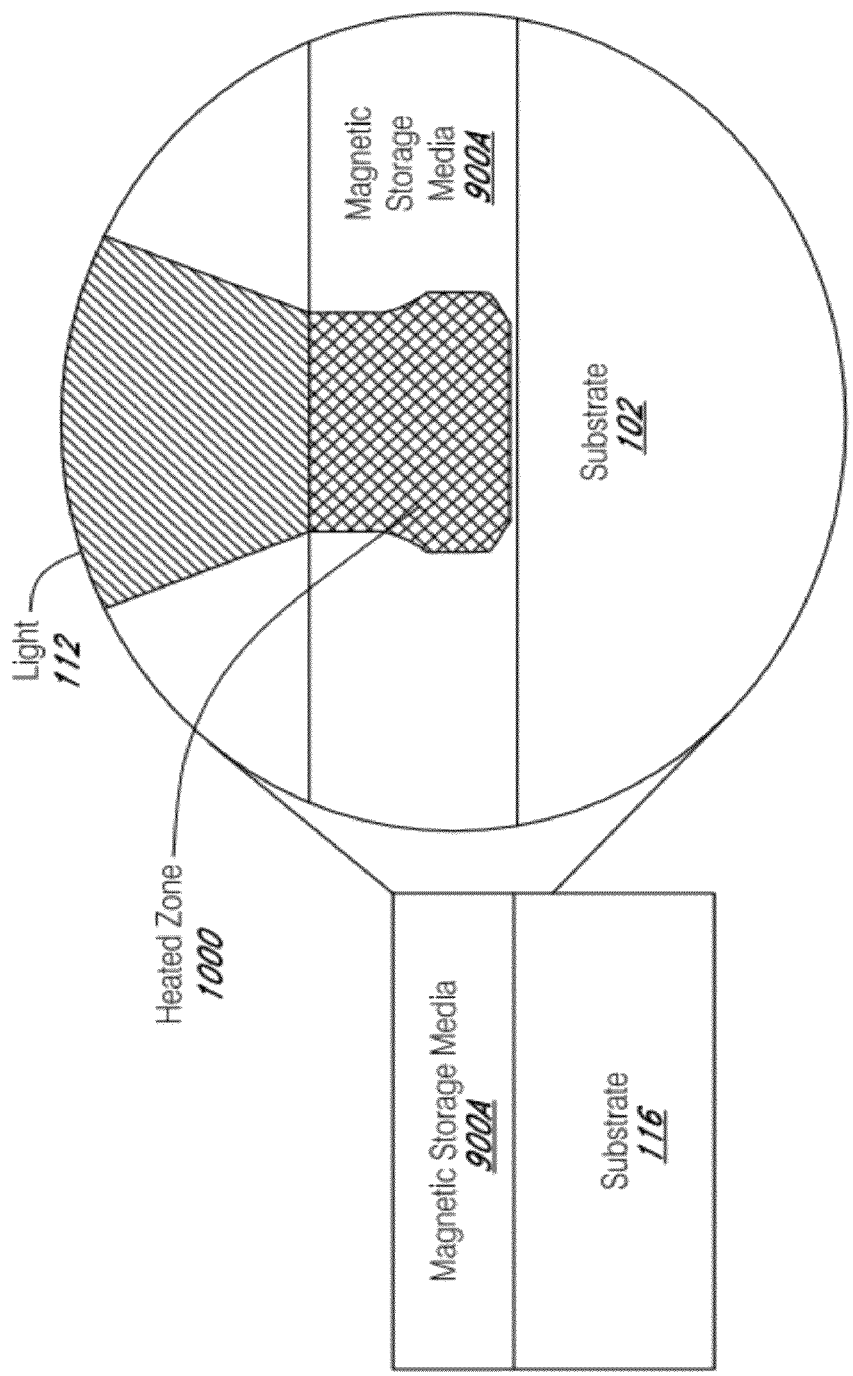
FIGS. 10A-10B are schematic illustrations of the near-field optical devices of FIG. 1 employed to heat localized regions of the magnetic storage media of FIGS. 9A and 9B.
Figure 10B:
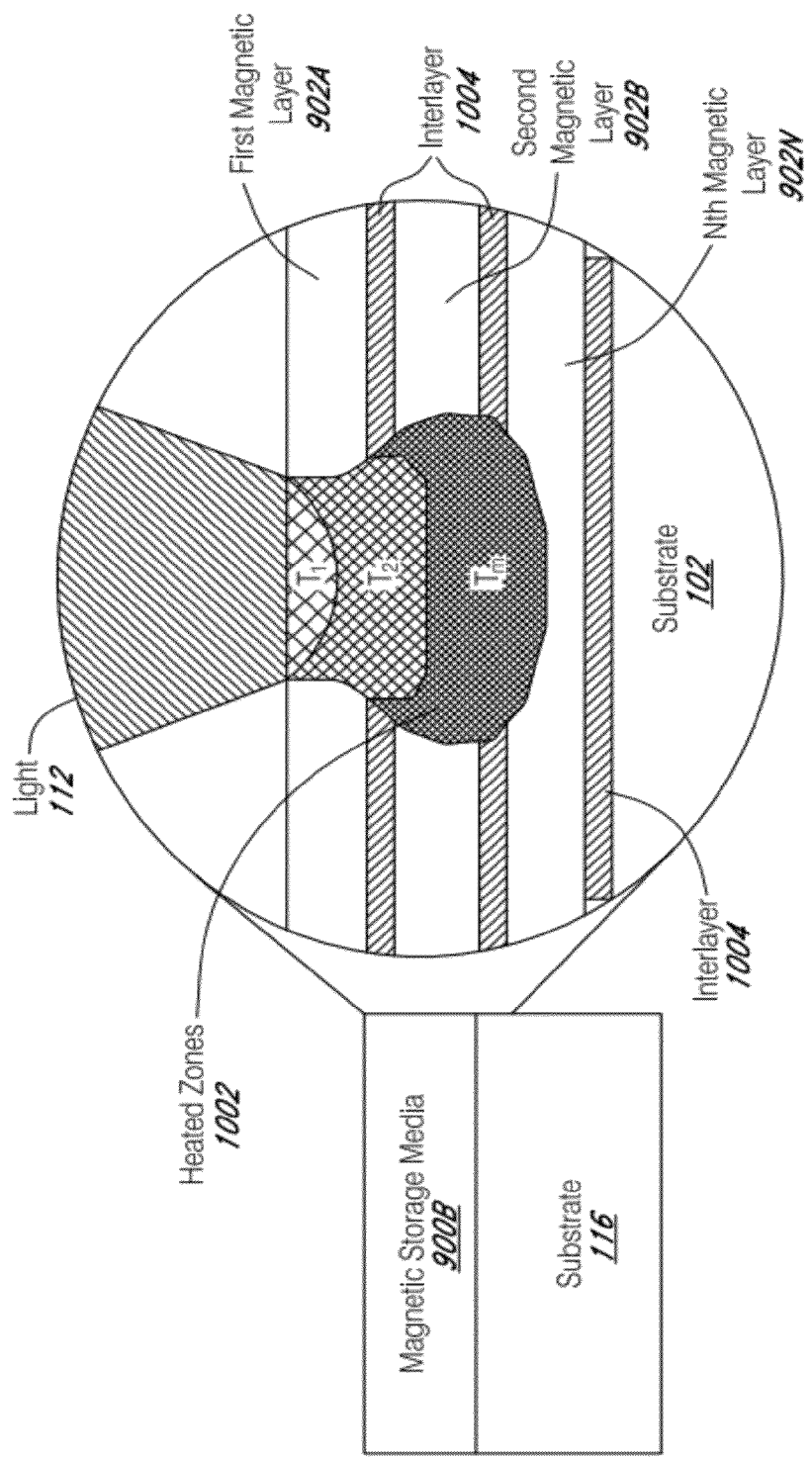

With reference to FIGS. 1 and 10A-10B, embodiments of the nanolaser 102 may be employed to heat the magnetic storage media 900 to about its Curie temperature within the local region 120. Heating the magnetic storage media 900 in this manner may change its coercivity within the local region 120 and, in conjunction with a reading/recording device 108 capable of providing magnetic write signals 114, information may be written to the magnetic storage media 900 within the local region without affecting information stored in other regions of the magnetic storage media 900.

For example, as illustrated in FIG. 10A, the power output of the light 112 focused upon a single-layered magnetic storage media 900A may be adjusted to locally heat the recording media 104 (e.g., heated zone 1000) to a selected temperature, such as about the Curie temperature, through at least a portion of its thickness. Alternatively, as illustrated in FIG. 10B, the power output of the light 112 focused upon a multi-layered magnetic storage media 900B may be adjusted substantially continuously in order to locally heat the magnetic layers 902 of the recording media 104 (e.g., magnetic layers 902A, 902B, ... 902N) to a selected temperature, such as about the Curie temperature of one or more selected magnetic layers 902. FIG. 10B illustrates heated zones 1004 of different temperature, such as zones $T_1, T_2, \ldots T_m$, that may be developed in this manner. As the power level of the light 112 is adjusted, not only the temperature of the heated zones 126, but also their size, may be varied.

In certain embodiments, the composition of magnetic storage media 900 may be given according to the formula $$FePtX$$

where Fe is iron, Pt, is platinum, and X is an element that may include, but is not limited to, copper (Cu), silver (Ag), gold (Au), palladium (Pd), chromium (Cr), carbon (C), silicon oxide ($SiO_2$), and titanium oxide ($TiO_2$). In certain embodiments, the concentration of iron within a magnetic storage media 900 may range between about 30 to 70 at. %, based upon the total number of atoms of the magnetic storage media 900. In other embodiments, the concentration of platinum within a magnetic storage media 900 may range between about 30 to 70 at. %, based upon the total number of atoms of the magnetic layer 124. In certain embodiments, the Fe concentration may be approximately 55 at. % and the Pt concentration may be approximately 45 at. %. In further embodiments, the concentration of element X within a magnetic storage media 900 may range between about 0 to 40 at. %, based upon the total number of atoms of the magnetic storage media 900.

In alternative embodiments, the magnetic storage media 900 may comprise $L1_0$ compositions. These compositions may be understood to be in reference to single-layered magnetic storage media 900A or individual layers of multi-layered magnetic storage media. Examples of $L1_0$ compositions may include, but are not limited to, cobalt-palladium (CoPd), cobalt-platinum (CoPt), and iron-palladium (FePd) compositions. In an embodiment, the concentration of cobalt within an $L1_0$ magnetic storage media 900 may range between about 30 to 70 at. %, based upon the total number of atoms of the magnetic storage media 900A or magnetic storage layer 902. In another embodiment, the concentration of iron within an $L1_0$ magnetic layer 124 may range between about 30 to 70 at. %, based upon the total number of atoms of the magnetic storage media 900A or magnetic storage layer 902. In other embodiments, the concentration of palladium within an $L1_0$ magnetic layer 124 may range between about 30 to 70 at. %, based upon the total number of atoms of the magnetic storage media 900A or magnetic storage layer 902. In additional embodiments, the concentration of platinum within an $L1_0$ magnetic layer 124 may range between about 30 to 70 at. %, based upon the total number of atoms of the magnetic storage media 900A or magnetic storage layer 902.

Figure 10C:
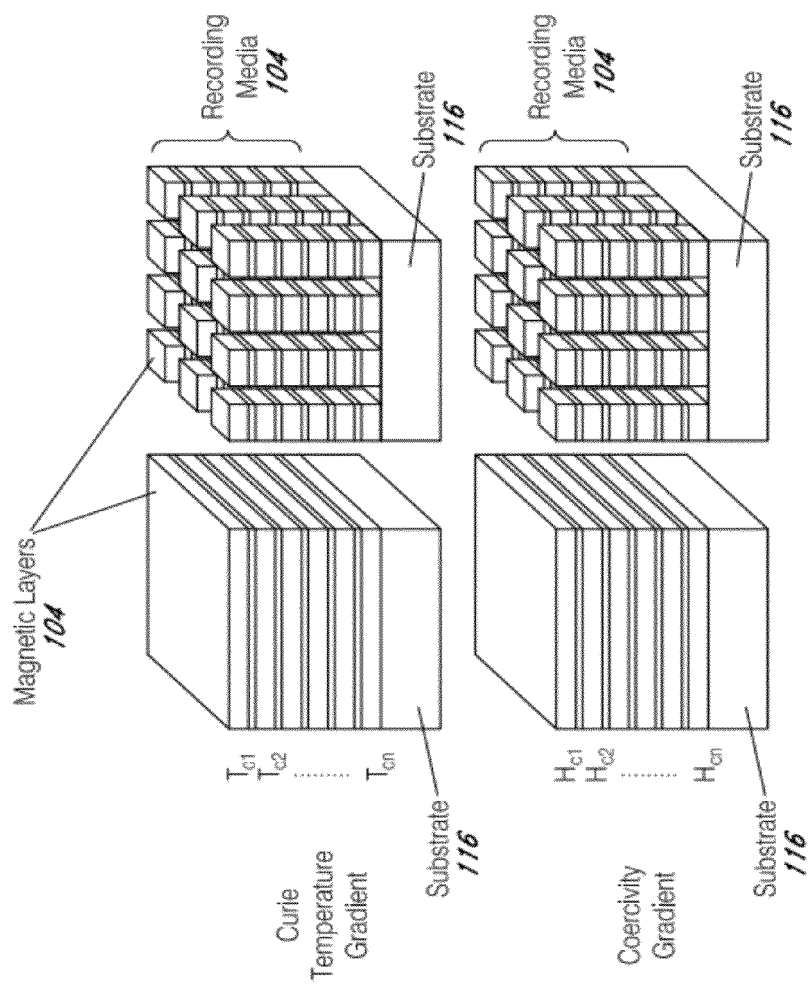
FIG. 10C is a schematic illustration of a multi-layered magnetic storage media which may be employed with embodiments of the near-field optical devices of FIG. 1. The storage media may be designed with coercivity gradients, magnetic moment gradients, and/or patterned in order to increase the coercivity of the layers of the magnetic storage media.

In embodiments of multi-layered magnetic storage media 900B, each magnetic layer 902 may also be configured with a selected coercivity and/or Curie temperature (FIG. 10C). In certain embodiments, the coercivity and/or Curie temperature of the magnetic layers 902 may be approximately equal. In other embodiments, the magnetic layers 902 may possess different coercivity values and/or Curie temperatures, providing a gradient in coercivity and/or Curie temperature through the thickness of the magnetic storage media 900B. For example, in certain embodiments, the coercivity of magnetic storage media 900B may range between about 500 to 80,000 Oe. In other embodiments, the Curie temperature of the magnetic storage media 900B may vary between about 300 to 800° C. In certain embodiments, the composition of the magnetic layers 902 may be varied in order to achieve variations in coercivity of the magnetic layers.

The deposition conditions under which the magnetic storage media 900 is deposited may also be selected so as to influence its coercivity. The magnetic storage media 900 comprises grains that have a certain grain size. For example, the mean grain size of the magnetic layers 124 may range between about 1 to 20 nm. Because magnetostatic interactions and exchange coupling between the grains of the magnetic storage media 900 play a role in the coercivity of the magnetic storage media 900, the farther that the grains are apart from one another within a given magnetic storage media 900, the less the interaction between magnetic grains between the magnetic storage media 900. Thus, alterations in processing conditions which influence the separation between grains and grain size of the magnetic storage media 900 may influence the coercivity of the magnetic storage media 900.

In one embodiment, the magnetic storage media 900 may be annealed at a temperature between about 200 to 700° C. In general, as the annealing temperature is increased, the coercivity of the magnetic storage media 900 increases. At higher temperature the $L1_0$ crystalline transformation, from Face-Centered-Cubic (FCC) to Face-Centered-Tetragonal (FCT), takes place and as a result, the magnetic properties of the magnetic media alter from magnetically soft to magnetically hard (up to about 100 k Oe).

In another embodiment, the pressure at which the magnetic storage media 900 is deposited may be varied between about 5 to 50 mtorr. In general, as the deposition pressure is increased, the coercivity increases for Co/Pd multilayered magnetic media and decreases for $L1_0$ based magnetic media. The influence of processing pressure on coercivity of an embodiment of the disclosed magnetic layers 124 is discussed in detail below in Example 3.

In further embodiments, the magnetic storage media 900 may possess a through-thickness gradient in magnetic moment. For example, such a gradient may be achieved by employing a multi-layered magnetic storage media 900B comprising plurality of magnetic layers 902 having varied magnetic moments. The magnetic moment gradient may be oriented such that magnetic layers 902 with larger moment are located close to the substrate 102 magnetic layers 902 with smaller moments are located closest to the surface of the media. Since the innermost layer will be the farthest away from the reading source, it will need to generate the maximum signal to be noticed by a detector In other embodiments, the magnetic storage media 900 may comprise a multi-layered magnetic storage media 900B comprising one or more interlayers 1004, as illustrated in FIG. 10B. The interlayers 1004 may function to provide at least one of exchange coupling and heat conduction. The interlayers 1004 may further enable magnetic isolation between the magnetic layers 902. In certain embodiments, an interlayer 1004 may be present between one or more of magnetic layers 902, such as 902A, 902B, . . . 902N. In other embodiments, an interlayer 1004 may be present between the substrate and magnetic layers 902. Examples of interlayer materials may include, but are not limited to, magnesium oxide (MgO), Cr, CrRu, Al, Pt, Ti, Ta, and Pd. The thickness of the interlayers 1004 may range between about 1 to 10 nm. For example, in certain embodiments, an MgO interlayer of about 4-8 nm may be employed.

In alternative embodiments, the interlayers 1004 may be selected so as to influence the coercivity of the magnetic recording material 900. In certain embodiments, an interlayer 1004 may be introduced between the magnetic recording material 900 and the substrate 102 in order to increase or decrease the coercivity of single-layered magnetic recording material 900A or the magnetic layers 902 of multi-layered magnetic storage media 900B. Examples of such interlayers 122 may include, but are not limited to, indium tin oxide (ITO), Pd, Ti, Ta, CrRu, Al, Cr, Pt. The thickness of coercivity influencing interlayers 122 may also range between about 1 to 30 nm.

In certain embodiments, the magnetic storage media 900 may also comprise one or more seed layers. The seed layers may be incorporated within the interlayers 1004 or may be provided separately from the interlayers 1004. The seed layers may act to induce the grains of the magnetic recording material 900 to grow in a selected orientation, which influences the magnetization orientation of the magnetic recording material 900. Examples of the seed layers may include, but are not limited to, Ta, Ti, CrRu, Cr, Pt, Pd, MgO, NiP, and Al. The thickness of the seed layers may range between about 4 to 100 nm. In certain embodiments, the thickness of the seed layers may range between about 2 to 10 nm.

In further embodiments, the recording media 104 may also be patterned, as illustrated in FIG. 10C. Patterning may assist in separating magnetic signals that emanate from the magnetic layers 902. Patterning may further assist in localizing heat transfer. For example, patterning may allow a distinct temperature and/or magnetic field to be set up within a magnetic layer 902 and/or interlayer 1004 without substantial interference or influence of adjacent magnetic layers 902 and/or interlayers 1004. Patterning multi-layered magnetic media 900B may further increase the signal to noise ratio between neighboring bits by significantly reducing the Inter-Symbol Interference (ISI) and thus increasing the number of effective recording levels. Examples of patterns may include, but are not limited to, columnar architectures. Patterns may be introduced by operations such as dry or/and wet etching.

The number and coercivity of magnetic layers 902 within multi-layered magnetic recording media 900B may also be selected so as to provide the recording media 104 with more than two stable magnetization states. Beneficially, the presence of more than 2 stable magnetization states within the recording media 104 may effectively provide improved storage density, as compared with recording media having only 2 stable magnetization states.

Figure 11A:
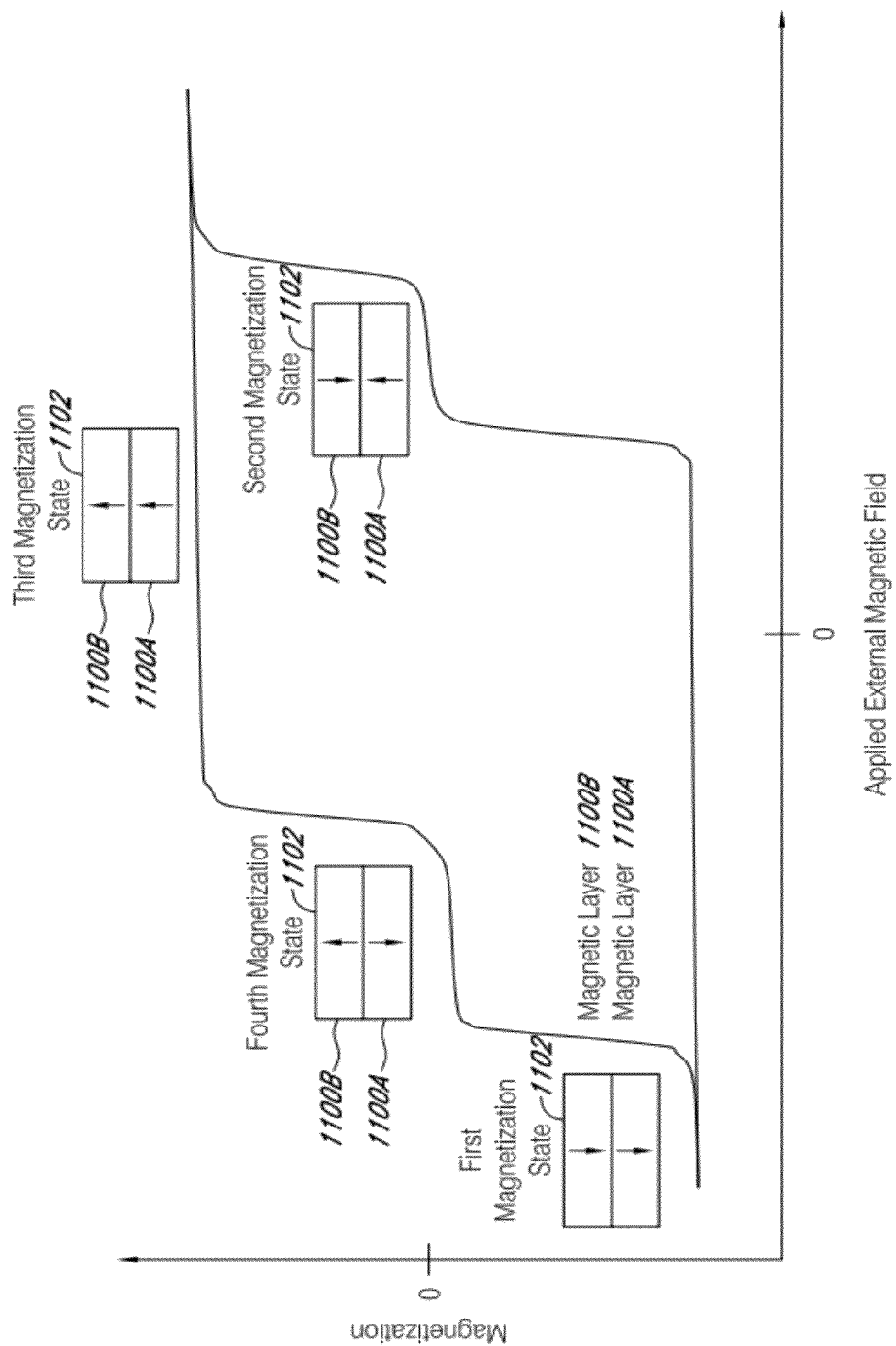
FIGS. 11A-11B are schematic illustrations of hysteresis plots showing the magnetization response, as a function of applied external field, of an embodiment of a two layer, 3-D magnetic storage media of the present disclosure. Multiple stable states of the 3-D magnetic storage media may be observed in the hysteresis plot.

Consider an example recording media 1102 in which first and a second magnetic layers 1100A and 1100B are present, having first and second coercivity values, respectively, that are different from one another. FIG. 11A illustrates one embodiment of a hysteresis curve for this magnetic storage media 1102, illustrating four stable magnetization states.

As the applied magnetic field is changed, the magnetization of the first and second magnetic layers 1100A, 1100B may transition through a plurality of stable, reproducible magnetization states. A first magnetization state, illustrated in the bottom right left hand corner of FIG. 11A, is achieved when the applied external magnetic field induces the magnetization of the first and second magnetic layers 1100A, 1100B to be oriented in a down direction. As the applied field is increased, the magnetization of the magnetic layer having the lowest coercivity, assumed to be magnetic layer 1100A for this example, may change to the up direction, causing the magnetization of the magnetic storage media 1102 to adopt a second magnetization state. Further increasing the applied field causes the magnetization of the remaining magnetic layer, in this case, magnetic layer 1100B, to also change from the down to the up orientation allowing the magnetic storage media 1102 to adopt a third magnetization state. Saturation may also be observed with further increases in applied field after adoption of the third magnetization state.

Reduction in the applied magnetic field from saturation may also cause changes in magnetization of one of the magnetic layers 1100A, 1100B, resulting in a change in magnetization from the up direction to the down direction. As illustrated in FIG. 11A, as the applied field is decreased, a fourth magnetization state may be adopted by the magnetic storage media 1102 when the magnetization of the lowest coercivity magnetic layer, magnetic layer 1100A, changes from the up to down orientation. Further reduction in the applied field causes the magnetization of the remaining magnetic layer, magnetic layer 1100B, to switch from the up to the down direction and returning the magnetic storage media 1102 to the first magnetization state.

Figure 11B:
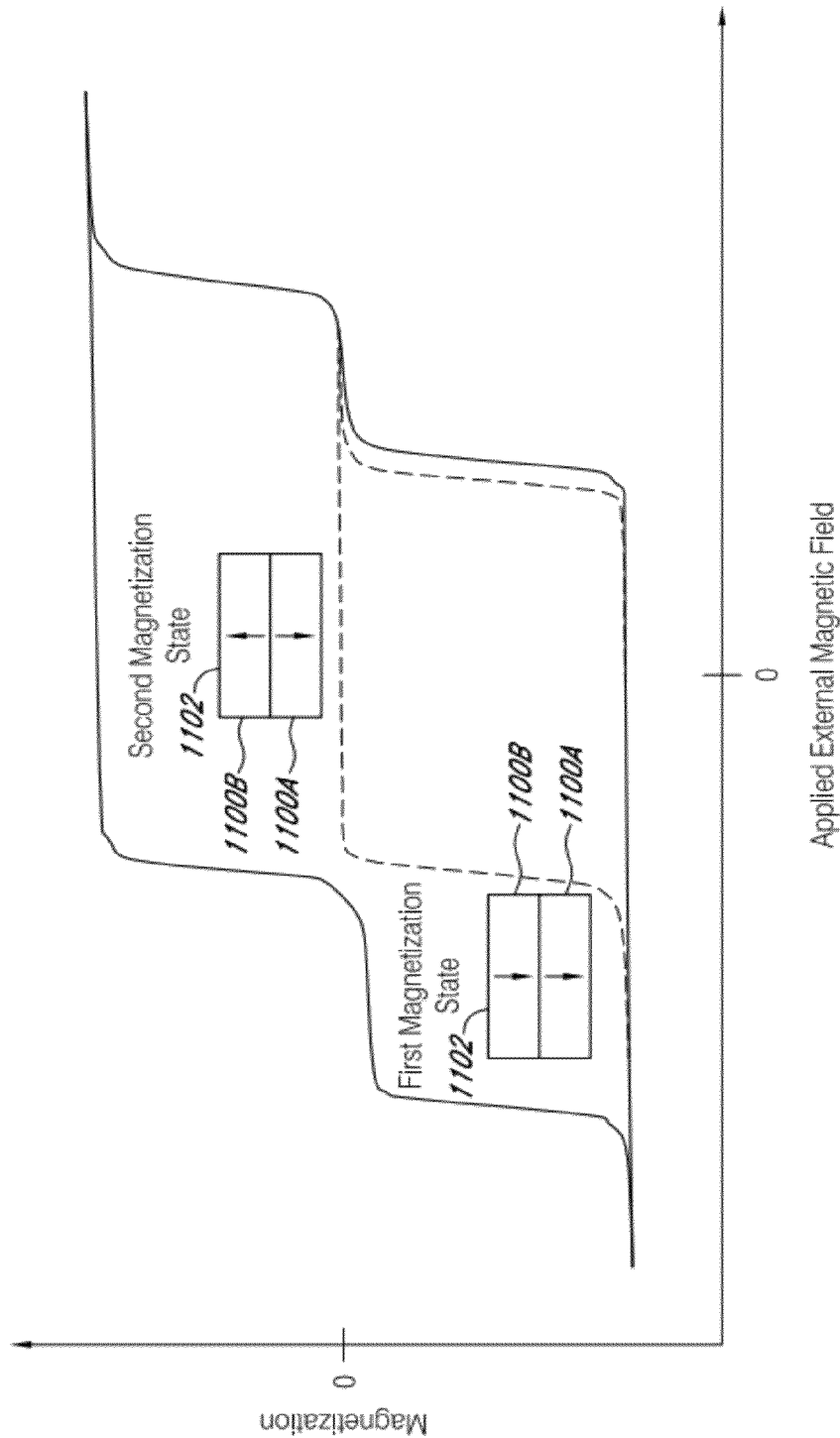

FIG. 11B illustrates an embodiment of a hysteresis loop for the above described system, illustrating the hysteresis behavior when only one of the first or second magnetic layers 1100A, 1100B is switched, while the remaining magnetic layer maintains its magnetization state. These hysteresis loops, referred to as a minor hysteresis loops, illustrate that embodiments of the magnetic storage media 1102 allow for magnetization switching of one of its magnetic layers without influencing the state of magnetization of the other of the other magnetic layers.

The information storage system 100 may further comprise a reading/recording device 112 for writing magnetic information to the magnetic storage media 104 and reading magnetic information from the magnetic storage media 900. In one embodiment, the reading/recording device 112 is configured to generate a read/write signal 116 comprising a magnetic field 116 that may be employed for magnetic reading and writing operations. In certain embodiments, the reading/recording device 112 may comprise a giant magnetoresistive (GMR) sensor, a collossal magnetoresistive (CMR) sensor, a tunneling magnetoresistive (TMR) element, or other magnetic field sensors, as known to those of skill in the art. It may be understood that the information storage system may comprise one or more reading/recording devices 112, as necessary.

In certain embodiments, magnetic storage within the bulk of the magnetic storage media 900 may be achieved by modulating the magnetic field strength with a particular light power. For example, $L1_0$-based magnetic storage material (e.g. FePt, CoPt) may theoretically achieve coercivity values up to about 5 T.

EXAMPLES

The following examples demonstrate the ability of embodiments of the disclosed nanolasers to provide high power output focused within nanometer scale areas. The performance of magnetic storage systems employing these nanolasers, in conjunction with multi-level magnetic storage media, are also presented. For example, it may be observed that multiple magnetization states may be achieved within the 3-D recording media, providing increased storage density. Furthermore, layers of the 3-D recording media may be configured with differing Curie temperatures and/or coercivity values, providing Curie temperature and coercivity gradients through the thickness of the 3-D recording media that enable multi-level recording and further increase the aerial density of such systems.

Example 1

Nanoaperture Film Fabrication and Heating System Performance

Figure 12A:
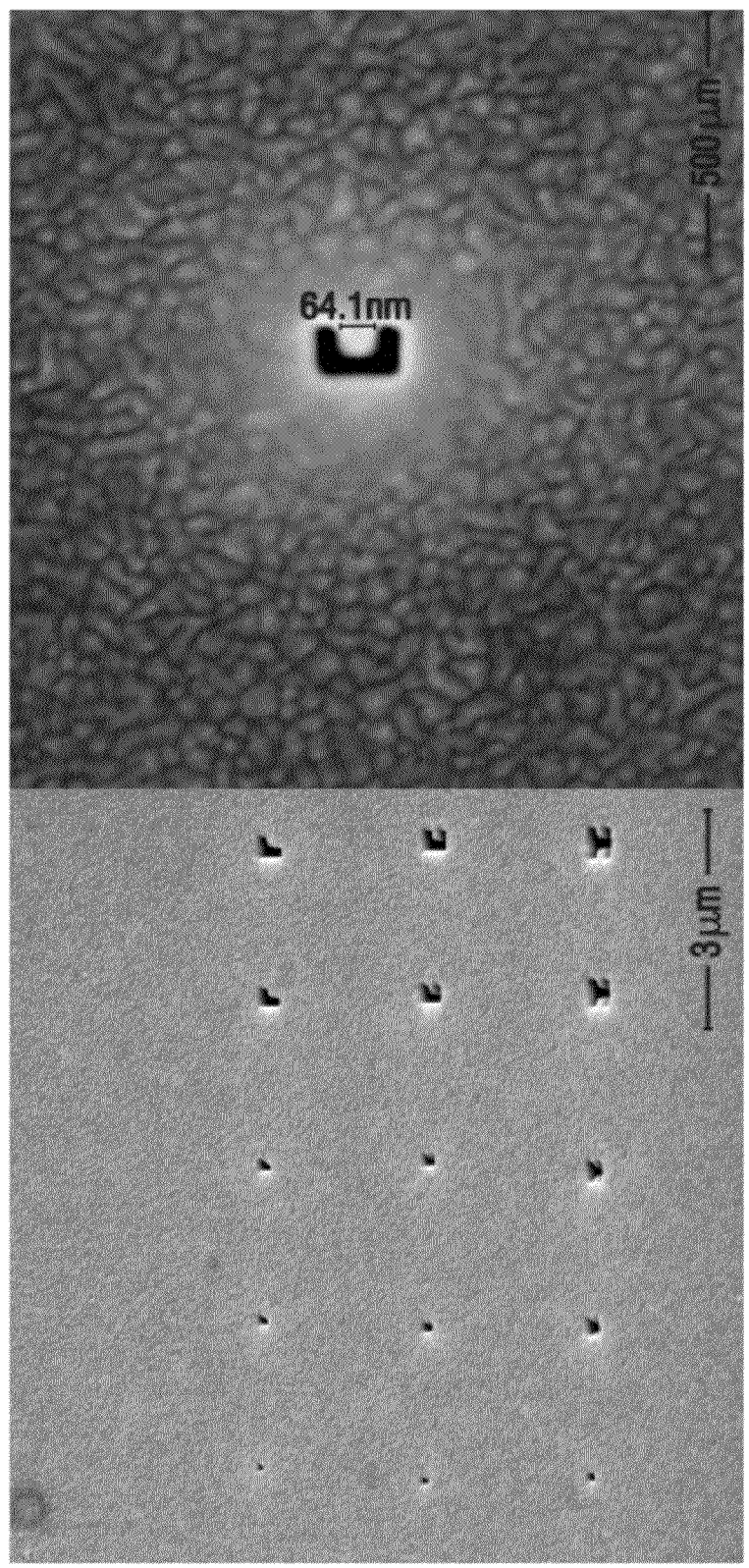
FIG. 12A presents representative scanning electron microscope (SEM) images of embodiments of aperture geometries that may be employed by the near-field optical devices of FIG. 1 for focusing.

Nanolasers were fabricated in accordance with embodiments discussed herein and characterized. An aluminum film having a thickness of approximately 120 nanometers was deposited upon the air bearing lens of the third lens 202C of the focusing system 110 by electron beam vapor deposition, and a high-resolution, focused ion beam FEI XP 800 system was employed to machine the aluminum film, introducing the aperture within the film. An ion beam having a gallium ion flux of approximately $1.3 \times 10^{19}$ Ga$^+$/s·cm, approximately 30 KeV Ga$^+$, and about 1 pA current was focused to a beam spot size of less than about 8 nm to perform a pixel by pixel milling of apertures. Representative SEM micrographs of C-shaped apertures formed in this manner are illustrated in FIG. 12A. It may be observed from FIG. 12A that the apertures are well defined and may be achieved over length scales at least as small as about 15 nm.

Figures 12B, 12C:
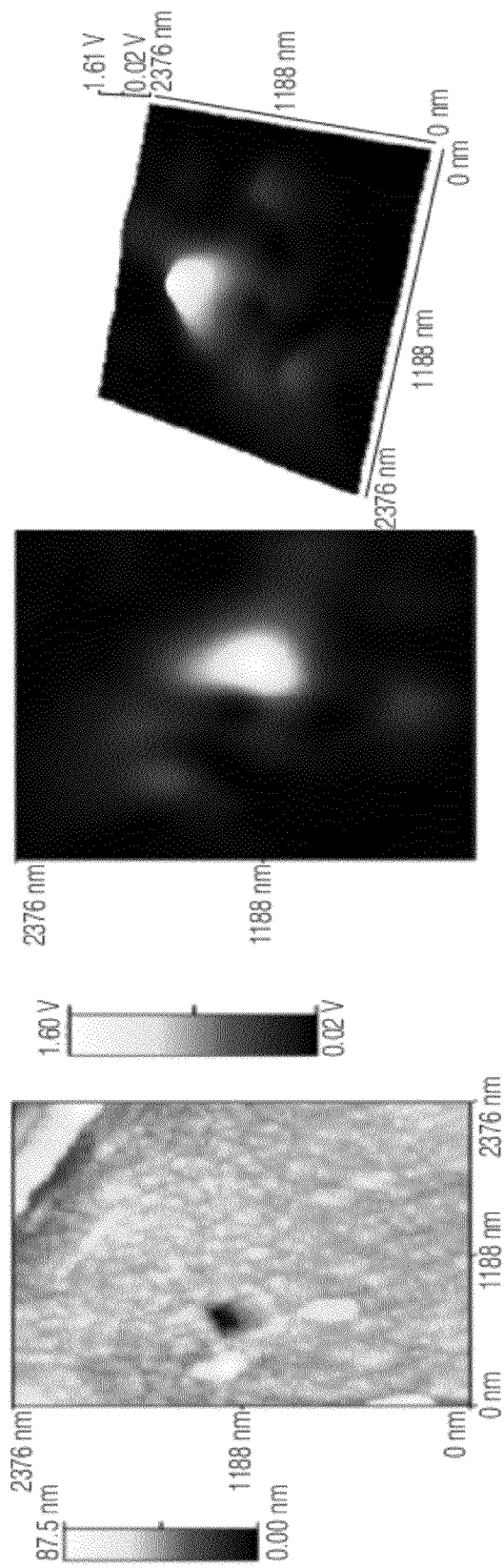
FIGS. 12B-12C present topography and optical images for light collected, in 2- and 3-dimensional contour representations, from embodiments of near-field optical devices of FIG. 1 that do not comprise negative index of refraction materials.

The lens was scanned via near-field scanning optical microscope (NSOM), where light is collected by an aluminum coated optical fiber probe via a photon multiplier tube (PMT) into an avalanche photodetector PIN-FET. An input power of approximately 80 µW was employed. Shear force measurements were concurrently taken in order to provide an independent measure of topography and to correlate the surface topography to emission profiles. FIG. 12B presents a topography image of the physical shape of a C-shaped aperture defined upon a metallized glass window of a laser diode, while FIG. 12C illustrates the corresponding near field intensity distribution.

Examining the intensity distribution, it may be observed that for the input power of approximately 80 µW, the output power was found to be approximately 0.53 µW. Assuming a linear dependence between the input and output powers, by employing an input power of approximately 250 mW, an output power of approximately 1.65 mW may be expected to be focused onto an approximately 35 nm spot.

Figure 12D:
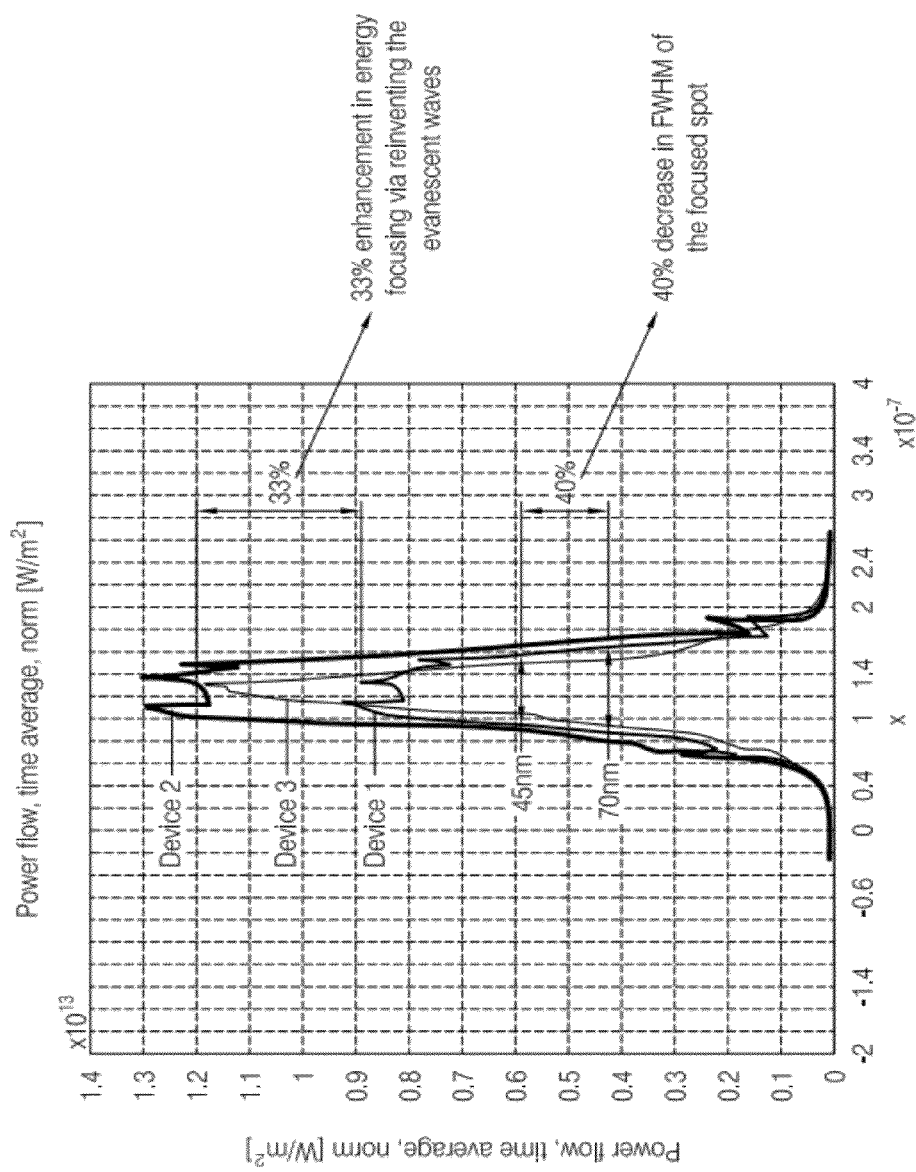
FIG. 12D is a plot of time averaged power flow, illustrating the advantages of employing negative index of refraction materials using the near-field optical devices of FIG. 1

FIG. 12D illustrates the time average power flow profile obtained for embodiments of nanolasers which did and did not comprise negative index of refraction materials for focusing. The performance of embodiments of three nanolaser devices are compared in FIG. 12D. Device 1 comprised a nanolaser which did not include an NIR structure within the focusing system. The profile illustrated in FIG. 12D is taken across a plane approximately 5 nm away from the point where light exited device 1. This distance falls within the range of distances at which a nanolaser may be positioned in a working device and, therefore, represents the power profile a storage media may experience. Device 2 comprised a nanolaser without a NIR structure included in the focusing system, similar to device 1, however in this case the power profile is measured when the light exited the nanolaser, rather than at about the position of the storage media. Device 3 comprised a nanolaser including a NIR structure within the focusing system. The NIR structure comprised a dielectric-metal layer structure about 50 nm thick, as described above. The profile was measured from about 5 nm from the point at which light exited the NIR structure.

As illustrated in FIG. 12D, the nanolaser comprising the NIR structure (device 3) exhibited significantly improved results, as compared to a nanolaser absent the NIR structure (devices 1 and 2). For example, when the power profile is measured at about 5 nm from point at which light exits the respective device, the nanolaser including the NIR structure (device 3) exhibited an approximately 33% enhancement in energy focusing, from about $0.9 \times 10^{13}$ W/m$^2$ to nearly $1.2 \times 10^{13}$ W/m$^2$ as compared to a nanolaser without the NIR structure.

Furthermore, device 3 including the NIR structure exhibited an approximately 40% decrease in full width at half maximum (FWHM) of the focused spot, from about 70 nm to 45 nm, as compared the profile measured for device 2, without the NIR structure. This result indicates that the NIR structure provides a confined profile without substantial loss of highly divergent photons. Taken together, these results illustrate that power flow may be increased and spot size may be decreased when employing negative index of refraction materials with embodiments of nanolasers of the present disclosure.

Example 2

Figure 13:
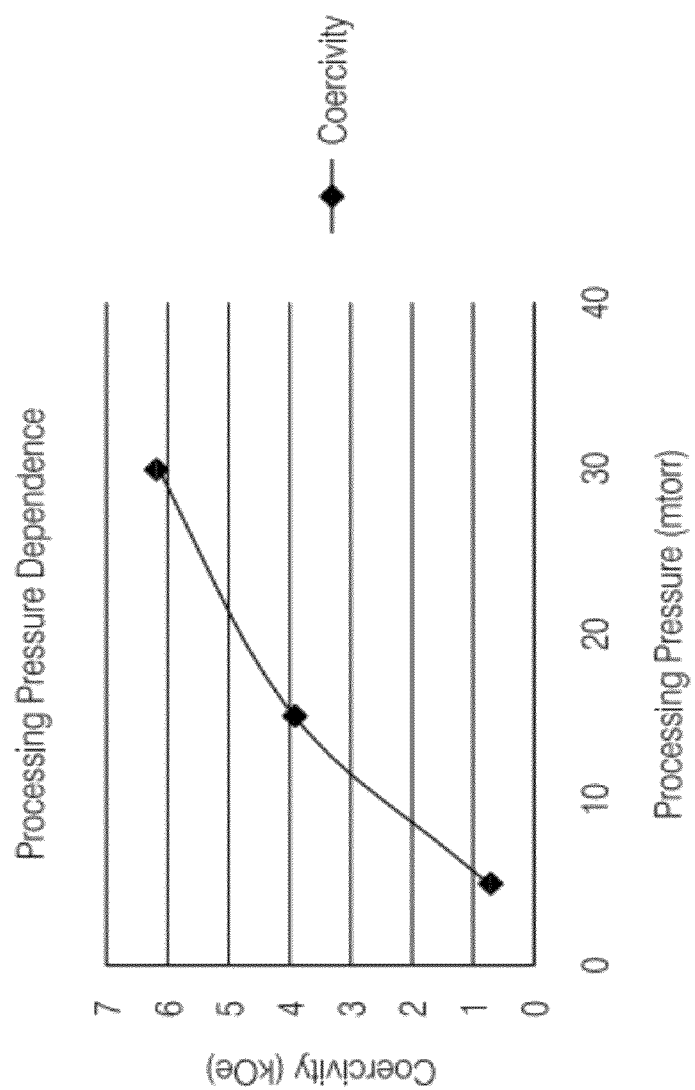
FIG. 13 is a plot of coercivity as a function of processing pressure for an embodiment of a multi-layered magnetic storage media of the present disclosure.

Hysteresis Properties of Multi-Layered-Magnetic Storage Media Having Varied Deposition Conditions As discussed above, the coercivity of the magnetic storage media 900 may be influenced by deposition parameters, such as the pressure at which the magnetic storage media 900 is deposited. The change in coercivity obtained with varying deposition pressure in an embodiment of a multilayer-based recording media 900B of the present disclosure is illustrated in FIG. 13. The composition of the recording media comprised a first seed layer of palladium having a thickness of about 5 nm, 7 bi-layers of a Co/Pd magnetic layer with cobalt and palladium thicknesses of about 0.36 nm and 0.55 nm, respectively, and a second layer of palladium having a thickness of about 5.3 nm which served as a protective layer. It may be observed from FIG. 13 that at a deposition pressure of about 5 mtorr, the measured coercivity of the multilayer-based recording media 900B is about 0.7-0.8 kOe. Increasing the deposition pressure from about 5 to 30 mtorr resulted in an increase in the coercivity value to about 6 kOe. This change represents a roughly six-fold increase in coercivity with an approximately six-fold increase in deposition pressure.

Example 3

Hysteresis Properties of Multi-Layered Magnetic Storage Media

An embodiment of a multi-level recording media 900B of the present disclosure was fabricated on a glass substrate and its magnetic hysteresis properties examined. The magnetic layers, from bottom (closest to the substrate) to top, comprised: a first palladium seed layer of about 5 nm, a first cobalt/palladium stack comprising [cobalt (about 0.36 nm)/palladium (about 0.55 nm)]×7, a second palladium seed layer of about 5.3 nm thickness, a second cobalt/palladium stack comprising [cobalt (0.36 nm)/palladium (about 0.55 nm)]×7, and a protective palladium layer having a thickness of about 5.3 nm. The first cobalt/palladium stack was deposited by sputtering under pressure of approximately 5 mtorr and the second stack was sputtered employing a pressure of approximately 30 mtorr.

Figure 14:
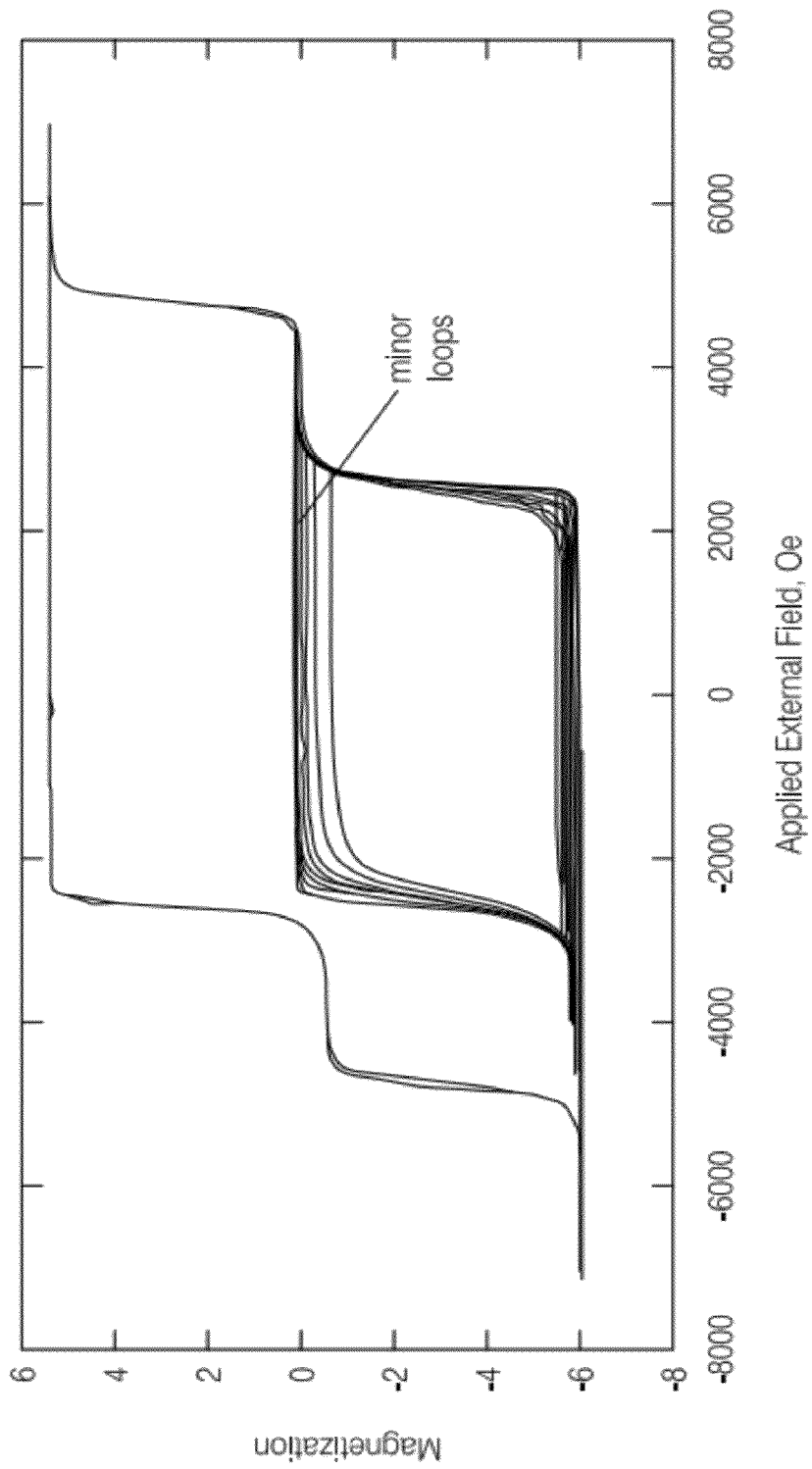
FIG. 14 is a plot of magnetization as a function of applied external field, of an embodiment of a two-layered magnetic storage media of the present disclosure.

FIG. 14 illustrates a hysteresis curve measured from an embodiment of the above magnetic recording media upon application of an external magnetic field ranging from about −7000 to 7000 Oe, with magnetization measured in arbitrary units. It may be observed that the hysteresis curve exhibits four states of magnetization. The first state is observed at an arbitrary magnetization value of approximately −6 for field strengths that are less than approximately −5600 Oe. This measurement indicates that the magnetization of the two stacks are oriented parallel to each other, in the down direction, and are additive.

As the field strength is increased above approximately 2500 Oe, the magnetization begins to increase until it reaches the second state, at an arbitrary magnetization value of approximately 0. This change in the measured magnetization indicates that the magnetization orientation of the lowest coercivity stack has changed to the up direction, becoming antiparallel with the other. The second magnetization state persists from approximately 3500 to 5000 Oe Further increasing the field strength beyond approximately 4500 Oe, the magnetization is again observed to rise from the level of the second state to the third state, at an arbitrary magnetization value of approximately 5.5. This change in the measured magnetization indicates that the magnetization orientation of the stack that was formerly in the down orientation in the second state has changed to the up direction. Once the third state is reached, further increases in the field strength do not result in further magnetization increases, indicating that the 3-D magnetic media is approximately saturated.

Upon decreasing the field strength below approximately −2500 Oe, the magnetization is observed to decrease from the level of the third state to the fourth state, at an arbitrary magnetization value of approximately −0.5. It may be observed that the fourth state persists from approximately −3500 to 5000 Oe. Further reductions in the field strength below about −5000 Oe result in the magnetization returning to approximately the level of the first state, at an arbitrary magnetization value of approximately −6.

In further embodiments, the field strength may be adjusted such that only one layer is switched in magnetization orientation, while the other maintains its magnetization state, as illustrated by the minor loops.

In summary, embodiments of the present disclosure provide systems and methods for high-density information storage. Novel nanolasers are employed for focusing light at nanoscale dimensions onto high-density storage media, such as protein-based media and magnetic storage media. For example, embodiments of the nanolasers disclosed herein may focus light to spot sizes smaller than about 50 nm. Examples of such storage media, including protein-based media and high-density magnetic storage media.

The high resolution to which the nanolaser is capable of focusing light enables the nanolaser to facilitate writing information to the storage media at densities higher than those presently achievable. In the case of protein based storage media, the nanolasers may be employed to provide light energy of selected wavelengths to photochromic proteins. The light energy may control transitions between stable intermediates in the photocycle of photochromic proteins, such as bacteriorhodopsin (BR). These stable intermediates may be distinguished on the basis of their respective spectral maxima, enabling subsequent read back of stored information. In the case of high-density magnetic storage media, the nanolasers may be employed to locally heat regions of the magnetic storage media, adjusting the local coercivity. These locally affected regions may have information written to them using magnetic recording devices, without affecting surrounding areas.

Although the foregoing description has shown, described, and pointed out the fundamental novel features of the present teachings, it will be understood that various omissions, substitutions, and changes in the form of the detail of the apparatus as illustrated, as well as the uses thereof, may be made by those skilled in the art, without departing from the scope of the present teachings. Consequently, the scope of the present teachings should not be limited to the foregoing discussion, but should be defined by the appended claims.

What is claimed is:

1. A near-field optical system for storing information to a high-density storage media, the system comprising:
   a light source in optical communication with a light focusing system comprising a plurality of lenses operative to focus light received from the light source;
   a film formed on a terminal lens of the focusing system, wherein the film is configured with at least one aperture having a dimension less than about 100 nm; and
   a negative index of refraction structure (NIR structure) positioned upon an air bearing surface of the film.

2. The system of claim 1, wherein the light source a laser diode.

3. The system of claim 1, wherein the film is about 50 to 300 nm in thick.

4. The system of claim 1, wherein the film comprises at least one of aluminum, gold, silver, and chromium, and alloys thereof.

5. The system of claim 1, wherein the geometry of the aperture comprise a C-shape, an hourglass shape, an H-shape, an L-shape, and combinations thereof.

6. The system of claim 1, wherein she NIR structure comprises a plurality of dielectric and metal layers.

7. The system of claim 1, wherein the NIR structure is about 50 to 150 thick.

8. The system of claim 1, further comprising at least one of a protein-based storage media and a magnetic storage media comprising one or more layers.

9. The system of claim 8, further comprising a negative index of refraction structure (NIR structure) positioned upon an air bearing surface of the protein-based storage media or the magnetic storage media.

10. The system of claim 8, wherein the protein based storage media comprises a photochromic protein.

11. The system of claim 10, wherein the photochromic protein comprises bacteriorhodopsin (BR).

12. The system of claim 8, wherein the at least one layer of the magnetic recording media comprises a composition given by FePtX, where X is Cu, Ag, Au, Pd, Cr, C, or no element.

13. The system of claim 8, wherein at least one layer of the magnetic recording media comprises an $L1_0$ material.

14. The system of claim 8, wherein the $L1_0$ material comprises one or more of cobalt-palladium (CoPd), cobalt-platinum (CoPt), and iron-palladium (FePd) and multilayer-based compositions comprising one or more of Co/Pt and Co/Pd.

15. The system of claim 8, wherein the Curie temperature of least one layer of the magnetic storage media ranges between about 300 to 800° C.

16. The system of claim 8, wherein the coercivity of at least one layer of the magnetic storage media ranges between about 500 to 80,000 Oe.

17. The system of claim 8, wherein the magnetic storage media exhibits greater than 2 magnetization states.

* * * * *